United States Patent
Yoshida

(10) Patent No.: US 11,908,688 B2
(45) Date of Patent: Feb. 20, 2024

(54) METHOD FOR MANUFACTURING NITRIDE SEMICONDUCTOR SUBSTRATE, NITRIDE SEMICONDUCTOR SUBSTRATE AND LAYERED STRUCTURE

(71) Applicant: SUMITOMO CHEMICAL COMPANY, LIMITED, Tokyo (JP)

(72) Inventor: Takehiro Yoshida, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 534 days.

(21) Appl. No.: 17/272,101

(22) PCT Filed: Aug. 22, 2019

(86) PCT No.: PCT/JP2019/032850
§ 371 (c)(1),
(2) Date: Jul. 13, 2021

(87) PCT Pub. No.: WO2020/045233
PCT Pub. Date: Mar. 5, 2020

(65) Prior Publication Data
US 2022/0005691 A1 Jan. 6, 2022

(30) Foreign Application Priority Data
Aug. 29, 2018 (JP) .................. 2018-159987

(51) Int. Cl.
*H01L 21/02* (2006.01)
*H01L 21/78* (2006.01)
(Continued)

(52) U.S. Cl.
CPC .... *H01L 21/02494* (2013.01); *H01L 21/0254* (2013.01); *H01L 21/0262* (2013.01);
(Continued)

(58) Field of Classification Search
None
See application file for complete search history.

(56) References Cited

U.S. PATENT DOCUMENTS 6,468,347 B1 10/2002 Motoki et al.
2006/0226414 A1 10/2006 Oshima
(Continued)

FOREIGN PATENT DOCUMENTS

JP 2001-102307 A 4/2001
JP 2005-072310 A 3/2005
(Continued)

OTHER PUBLICATIONS

International Searching Authority, "International Search Report," issued in connection with International Patent Application No. PCT/JP2019/032850, dated Oct. 8, 2019.
(Continued)

*Primary Examiner* — Michael Lebentritt
(74) *Attorney, Agent, or Firm* — Foley & Lardner LLP

(57) ABSTRACT

A method for manufacturing a nitride semiconductor substrate, including: a step of preparing a base substrate; a step of forming a mask layer having a plurality of openings on the main surface of the base substrate; a first step of growing a first layer whose surface is composed only of inclined interfaces; and a second step of epitaxially growing a single crystal of a group III nitride semiconductor on the first layer, making the inclined interfaces disappear, and growing a second layer having a mirror surface, wherein in the first step, at least one valley and a plurality of tops are formed at an upper side of each of the plurality of openings of the mask layer by forming a plurality of concaves on a top surface of the single crystal and making the (0001) plane disappear.

12 Claims, 17 Drawing Sheets

(51) Int. Cl.
*H01L 29/04* (2006.01)
*H01L 29/20* (2006.01)

(52) U.S. Cl.
CPC .... *H01L 21/02609* (2013.01); *H01L 21/7806* (2013.01); *H01L 29/045* (2013.01); *H01L 29/2003* (2013.01)

(56) References Cited

U.S. PATENT DOCUMENTS

| | | | |
|---|---|---|---|
| 2009/0221131 | A1 | 9/2009 | Kubota et al. |
| 2012/0012984 | A1 | 1/2012 | Shimodaira et al. |
| 2012/0074403 | A1 | 3/2012 | Fujiwara et al. |
| 2012/0112188 | A1* | 5/2012 | Yokoyama ........ H01L 21/02458 257/51 |
| 2014/0363954 | A1* | 12/2014 | Kumegawa ........... C30B 29/406 438/694 |
| 2019/0198312 | A1* | 6/2019 | Yoshida ............... H01L 29/045 |

FOREIGN PATENT DOCUMENTS

| | | |
|---|---|---|
| JP | 2006-290676 A | 10/2006 |
| JP | 2009-231816 A | 10/2009 |
| JP | 2010-070430 A | 4/2010 |
| JP | 2012-066983 A | 4/2012 |
| JP | 2013-107819 A | 6/2013 |
| JP | 2013-214686 A | 10/2013 |
| JP | 2018-027893 A | 2/2018 |
| JP | 2018-030763 A | 3/2018 |
| JP | 2018-030764 A | 3/2018 |
| WO | WO-2010/092736 A1 | 8/2010 |
| WO | WO-2015/037232 A1 | 3/2015 |

OTHER PUBLICATIONS

International Searching Authority, "Written Opinion," issued in connection with International Patent Application No. PCT/JP2019/032850, dated Oct. 8, 2019.
International Preliminary Report on Patentability issued in connection with International Patent Application No. PCT/JP2019/032850, dated Mar. 2, 2021.

* cited by examiner

S100 Base substrate preparation step
S180 Mask layer forming step
S220 Inclined interface expansion step
S240 Inclined interface maintenance step
S320 a c-plane expansion step
S340 Main growth step S400 Slicing step
S500 Polishing step

[Sample 1]
c-plane remaining region

A = Second c-plane growth region
B = Inclined interface growth region
C = First c-plane growth region
D = Base substrate
E = Second layer
F = First layer

[Sample 2]

A = Second c-plane growth region
B = Inclined interface growth region
C = First c-plane growth region
D = Base substrate
E = Second layer
F = First layer A = Second c-plane growth region  E = Second layer
B = Inclined interface growth region  F = First layer
C = First c-plane growth region
D = Base substrate

[Sample 2]

On mask layer

[Sample 3]

A = Second c-plane growth region  
B = Inclined interface growth region  
C = First c-plane growth region  
D = Base substrate  
E = Second layer  
F = First layer  
G = Boundary surface

[Sample 4]

A = Second c-plane growth region  E = Second layer
B = Inclined interface growth region  F = First layer
C = First c-plane growth region  G = Boundary surface
D = Base substrate

METHOD FOR MANUFACTURING NITRIDE SEMICONDUCTOR SUBSTRATE, NITRIDE SEMICONDUCTOR SUBSTRATE AND LAYERED STRUCTURE

CROSS-REFERENCE TO RELATED APPLICATIONS

The present application claims priority under 37 U.S.C. § 371 to International Patent Application No. PCT/JP2019/032850, filed Aug. 22, 2019, which claims priority to and the benefit of Japanese Patent Application No. 2018-159987, filed on Aug. 29, 2018. The contents of these applications are hereby incorporated by reference in their entireties.

TECHNICAL FIELD

The present disclosure relates to a method for manufacturing a nitride semiconductor substrate, a nitride semiconductor substrate and a laminated structure.

DESCRIPTION OF RELATED ART

A so-called ELO (Epitaxial Lateral Overgrown) method is known as a method for growing a single crystal of a group III nitride semiconductor. In the ELO method, for example, first, a mask layer having predetermined openings is formed on a base substrate. After the mask layer is formed, a facet structure having a triangular cross section is grown on the base substrate through the openings of the mask layer. When the facet structure is further grown, a V-shaped groove formed by the facet structure is embedded, and a flat crystal layer is obtained. At this time, since the dislocations are bent during a growth process of the facet structure, the dislocations reaching a surface of the crystal layer are reduced (for example, Patent Documents 1 and 2).

PRIOR ART DOCUMENT

Patent Document

[Patent Document 1] Japanese Unexamined Patent Publication No. 2018-030763
[Patent Document 2] Japanese Unexamined Patent Publication No. 2018-030764

Here, in the above-described ELO method, it is possible to widen a region where the dislocation density is lowered in the surface of a crystal layer by lengthening a pitch of the mask layer, that is, by increasing opening width.

However, the inventor has found that the following problems occur when the pitch of the mask layer is lengthened.

When the pitch of the mask layer is lengthened, it becomes difficult to make the (0001) plane disappear during the growth process of the facet structure, and it becomes difficult to form the facet structure having a triangular cross section with a sharp top. Therefore, the crystal layer grows while the (0001) plane remains. If the (0001) plane remains, the dislocations are not bent and propagate to the surface of the crystal layer. As a result, there is a possibility that the dislocation density in the surface of the crystal layer is not sufficiently lowered.

Further, due to lengthening of the pitch of the mask layer, the height from the main surface of the base substrate to the top of the facet structure is increased. Therefore, it takes a long time to flatten the crystal layer. As a result, there is a possibility of reduction in productivity of the nitride semiconductor substrate obtained by slicing the crystal layer.

The present disclosure is based on the above-described novel subject found by the inventor, and an object of the present invention is to efficiently lower the dislocation density in the main surface of a nitride semiconductor substrate.

According to an aspect of the present disclosure, there is provided a method for manufacturing a nitride semiconductor substrate, which is a method for manufacturing a nitride semiconductor substrate with a vapor deposition method, including:

a step of preparing a base substrate comprising a single crystal of a group III nitride semiconductor, and having a main surface whose closest low index plane is a (0001) plane;

a step of forming a mask layer having a plurality of openings on the main surface of the base substrate;

a first step of epitaxially growing a single crystal of a group III nitride semiconductor on the main surface of the base substrate through the openings of the mask layer, the single crystal of the group III nitride semiconductor being sandwiched between a pair of inclined interfaces other than the (0001) plane and having a top surface with the (0001) plane exposed, then, forming a plurality of concaves composed of the inclined interfaces other than the (0001) plane on the top surface, gradually expanding the inclined interfaces toward an upper side of the main surface of the base substrate, making the (0001) plane disappear from the top surface, and growing a first layer whose surface is composed only of the inclined interfaces; and a second step of epitaxially growing a single crystal of a group III nitride semiconductor on the first layer, making the inclined interfaces disappear, and growing a second layer having a mirror surface, wherein in the first step, at least one valley and a plurality of tops are formed at an upper side of each of the plurality of openings of the mask layer by forming the plurality of concaves on the top surface of the single crystal and making the (0001) plane disappear, and observation of an arbitrary cross section perpendicular to the main surface reveals that, an average distance between a pair of tops separated in a direction along the main surface is more than 100 µm, the pair of tops being closest to each other among the plurality of tops, with one valley sandwiched between them.

According to other aspect of the present disclosure, there is provided a nitride semiconductor substrate, having a diameter of 2 inches or more and having a main surface whose closest low index crystal plane is a (0001) plane, wherein observation of the main surface of the nitride semiconductor substrate with a multiphoton excitation microscope to obtain a dislocation density from a dark spot density, reveals that:

the main surface includes a low dislocation density region with a dislocation density of less than $1 \times 10^6$ cm$^{-2}$, and a high dislocation density region where a dislocation density is higher than the dislocation density of the low dislocation density region and is $3 \times 10^6$ cm$^{-2}$ or less, which are arranged alternately, and at least a part of the low dislocation density region includes a dislocation-free region of 50 µm square or more.

According to further another aspect of the present disclosure, there is provided a laminated structure, including:

a base substrate comprising a single crystal of a group III nitride semiconductor and having a main surface whose closest low index crystal plane is a (0001) plane;

a mask layer provided on the main surface of the base substrate and having a plurality of openings;

a first low oxygen concentration region provided on the main surface of the base substrate through the openings of the mask layer and comprising a single crystal of a group III nitride semiconductor;

a high oxygen concentration region provided on the first low oxygen concentration region and comprising a single crystal of a group III nitride semiconductor; and a second low oxygen concentration region provided on the high oxygen concentration region and comprising a single crystal of a group III nitride semiconductor, wherein an oxygen concentration in the high oxygen concentration region is higher than an oxygen concentration in each of the first low oxygen concentration region, and the second low oxygen concentration region, and observation of an arbitrary cross section perpendicular to the main surface reveals that, a top surface of the first low oxygen concentration region includes at least one valley and a plurality of mountains at an upper side of each of the plurality of openings of the mask layer, and an average distance between a pair of mountains separated in a direction along the main surface is more than 100 μm, the pair of mountains being closest to each other among the plurality of mountains, with one valley sandwiched between them.

According to the present invention, the dislocation density in the main surface of the nitride semiconductor substrate can be efficiently lowered.

BRIEF DESCRIPTION OF THE DRAWINGS

FIG. 4 is a schematic perspective view illustrating a part of a method for manufacturing a nitride semiconductor substrate according to an embodiment of the present disclosure.

DETAILED DESCRIPTION OF THE DISCLOSURE

An Embodiment of the Present Invention

Hereinafter, an embodiment of the present invention will be described with reference to the drawings.

(1) Method for Manufacturing a Nitride Semiconductor Substrate

A method for manufacturing a nitride semiconductor substrate according to the present embodiment will be described with reference to FIGS. 1 to 5.

Figure 1:
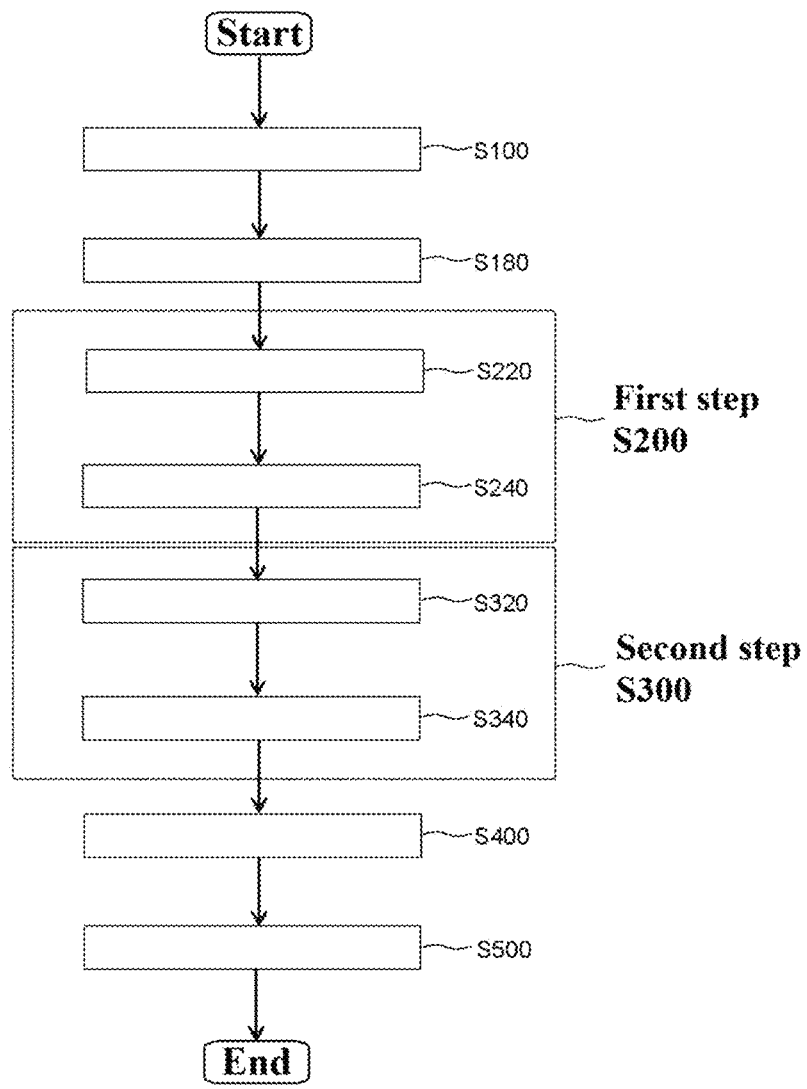
FIG. 1 is a flowchart illustrating a method for manufacturing a nitride semiconductor substrate according to an embodiment of the present disclosure.

FIG. 1 is a flowchart illustrating a method for manufacturing a nitride semiconductor substrate according to the present embodiment. FIGS. 2(a) to (c), FIGS. 4(a) to 5 (b) are schematic sectional views illustrating a part of the method for manufacturing a nitride semiconductor substrate according to the present embodiment. FIG. 3 is a schematic perspective view illustrating a part of the method for manufacturing a nitride semiconductor substrate according to the present embodiment. FIG. 3 corresponds to a perspective view at a time point of FIG. 2(b), and illustrates a part of a first layer 30 growing on a base substrate 10. Further, a thin solid line indicates a crystal plane in a process of growth in FIG. 4(b), and a dotted line indicates dislocations in FIGS. 2(c) to 5(b).

As illustrated in FIG. 1, the method for manufacturing a nitride semiconductor substrate according to the present embodiment includes: for example, a base substrate preparation step S100, a mask layer forming step S180, a first step S200, a second step S300, a slicing step S400, and a polishing step S500.

(S100: Base Substrate Preparation Step)

First, in the base substrate preparation step S100, a base substrate 10 comprising a single crystal of a group III nitride semiconductor is prepared. In the present embodiment, for example, a gallium nitride (GaN) free-standing substrate is prepared as the base substrate 10.

Hereinafter, in a crystal of a group III nitride semiconductor having a wurtzite structure, <0001> axis (for example, [0001] axis) is referred to as "c-axis", and (0001) plane is referred to as "c-plane". The (0001) plane may be referred to as a "+c plane (group III element polar plane)", and the (000-1) plane may be referred to as a "-c plane (nitrogen (N) polar plane)". Further, <1-100> axis (for example, [1-100] axis) is referred to as "m-axis", and {1-100} plane is referred to as "m-plane". m-axis may be expressed as <10-10> axis. Further, <11-20> axis (for example, [11-20] axis) is referred to as "a-axis", and {11-20} plane is referred to as "a-plane".

In the base substrate preparation step S100 of the present embodiment, for example, the base substrate 10 is prepared by a VAS (Void-Assisted Separation) method.

Specifically, for example, the base substrate 10 is prepared by the following procedure. First, a substrate made of sapphire or the like is prepared. After the substrate is prepared, for example, a first crystal layer made of, for example, gallium nitride (GaN) is grown on the substrate by a metalorganic vapor phase growth (MOVPE) method. After the first crystal layer is grown, a metal layer made of, for example, titanium (Ti) is deposited on the first crystal layer. After the metal layer is vapor-deposited, for example, the substrate is heat-treated in an atmosphere containing ammonia gas. Thereby, the metal layer is nitrided to form a metal nitride layer having high-density fine holes on a surface. Further, by performing the above-described heat treatment, a part of the first crystal layer is etched through the holes of the metal nitride layer to form high-density voids in the first crystal layer. After forming the metal nitride layer and the void-containing first crystal layer, for example, a hydride vapor phase growth (HVPE) method is used to grow a second crystal layer comprising, for example, GaN on the void-containing first crystal layer and the metal nitride layer. In a process of cooling the substrate after the growth of the second crystal layer is completed, the second crystal layer naturally peels off from the substrate at a boundary between the void-containing first crystal layer and the metal nitride layer. After the peeled second crystal layer is obtained, the second crystal layer is sliced and polished.

By the above-described base substrate preparation step S100, the base substrate 10 comprising a single crystal of GaN is obtained.

A diameter of the base substrate 10 is, for example, 2 inches or more. A thickness of the base substrate 10 is, for example, 300 µm or more and 1 mm or less.

The main surface 10s of the base substrate 10 has, for example, a main surface (base surface) 10s which is an epitaxial growth surface. In the present embodiment, a lowest index crystal plane closest to the main plane 10s is, for example, a c-plane (+c-plane) 10c.

Further, in the present embodiment, for example, a predetermined off-angle may be imparted to the main surface 10s of the GaN crystal constituting the base substrate 10. The "off-angle" here means the angle formed by the c-axis with respect to the normal of the main surface 10s. Specifically, the size of the off-angle on the main surface 10s of the base substrate 10 is, for example, more than 0° and 1° or less.

A size and a direction of the off-angle can be adjusted, for example, by a size and a direction of the off-angle of the crystal growth substrate used in the above-described VAS method, and by a slicing angle and a slicing direction at the time of slicing.

Further, in the present embodiment, since the base substrate 10 is prepared by the above-described VAS method, the dislocation density in the main surface 10s of the base substrate 10 is low. Specifically, the dislocation density in the main surface 10s of the base substrate 10 is, for example, $3 \times 10^6$ cm$^{-2}$ or more and less than $1 \times 10^7$ cm$^{-2}$.

(S180: Mask Layer Forming Step)

After preparing the base substrate 10, for example, a mask layer 20 is formed on the base substrate 10 by a sputtering method. The mask layer 20 is, for example, a silicon oxide (SiO$_2$) layer, a silicon nitride (SiN) layer, or the like. At this time, a thickness of the mask layer 20 is 300 nm or more and 2 µm or less. After forming the mask layer 20, the mask layer 20 is patterned by a photolithography method.

Figure 2A:
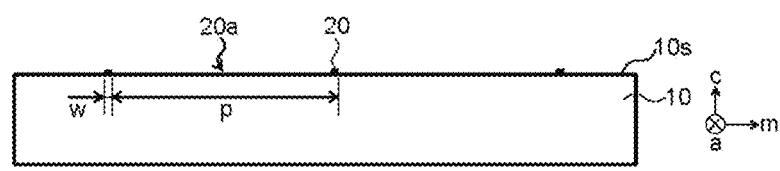
FIGS. 2(a) to 2(c) are schematic cross-sectional views illustrating a part of a method for manufacturing a nitride semiconductor substrate according to an embodiment of the present disclosure.
Figure 3:
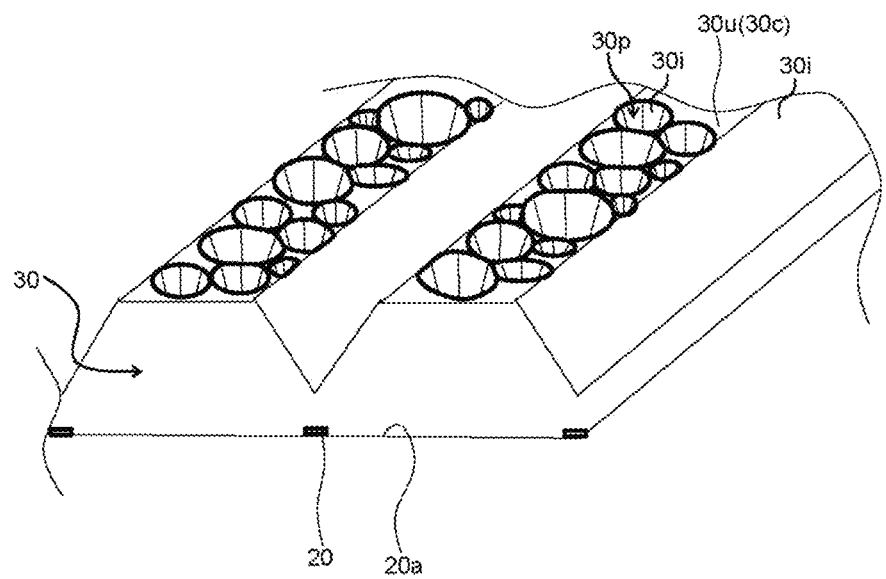
FIG. 3 is a schematic perspective view illustrating a part of a method for manufacturing a nitride semiconductor substrate according to an embodiment of the present invention.

Thereby, as illustrated in FIG. 2(a), the mask layer 20 having a plurality of predetermined openings 20a is formed. By forming the mask layer 20 having the plurality of openings 20a, three-dimensional growth of a GaN single crystal can be induced in the first step S200 described later.

At this time, the openings 20a of the mask layer 20 are formed in a striped shape extending along either a direction along the m-axis or a direction along the a-axis, for example. A case where the openings 20a of the mask layer 20 referred to here are "striped shape extending along either the direction along the m-axis or the direction along the a-axis" includes not only a case where the direction of extending the striped openings 20a is a direction that completely coincides with the direction along the m-axis or the direction along the a-axis in a plan view, but also a case where the direction is slightly inclined with respect to the direction along the m-axis or the direction along the a-axis. In at least one unit opening forming the striped openings 20a, it may be considered that a length of a directional component of either the direction along the m-axis or the direction along the a-axis is longer than a length of the other directional component. At least one unit opening forming the striped openings 20a does not necessarily have to extend from one end to the other end of the main surface 10s of the base substrate 10.

In the present embodiment, the openings 20a of the mask layer 20 are formed into, for example, a striped shape extending along the direction along the a-axis.

Further, at this time, width w of each of the striped mask layers 20 is, for example, 1 µm or more and 100 µm or less, preferably 5 µm or more and 30 µm or less. Since the width w of the mask layer 20 is 1 µm or more, disconnection of the mask layer 20 can be suppressed and the yield of patterning can be improved. Further, since the width w of the mask layer 20 is 5 µm or more, the yield of patterning can be further improved. On the other hand, since the width w of the mask layer 20 is 100 µm or less, the generation of abnormal crystal nuclei can be suppressed on the mask layer 20 in the first step S200 described later. Further, since the width w of the mask layer 20 is 30 µm or less, the generation of abnormal crystal nuclei can be stably suppressed on the mask layer 20 in the first step S200 described later.

Further, each pitch p of the striped mask layer 20 affects, for example, a distance in which dislocations bend and propagate in the first step S200 and the second step S300, which will be described later, that is, it affects an area of the low dislocation density region in the main surface is of the nitride semiconductor substrate 1. Conventionally, when a pitch p of the mask layer 20 is wide, it has been difficult to grow a stable GaN crystal. However, in the present embodiment, since the substrate prepared by the VAS method is used as the base substrate 10, a first layer 30 described later can be stably grown even when the pitch p of the mask layer 20 is wide.

Specifically, in the present embodiment, each pitch p of the mask layer 20 is, for example, 800 μm or more, preferably 1 mm or more. When the pitch p of the mask layer 20 is less than 800 μm, a high dislocation density region is formed at an upper side of the mask layer 20, and therefore when cutting out a semiconductor device from the nitride semiconductor substrate 1, there is a possibility that the high dislocation density region is included in the semiconductor device. In contrast, since the pitch p of the mask layer 20 is 800 μm or more, the inclusion of the high dislocation density region in the semiconductor device can be suppressed, and the semiconductor device can be cut out mainly from the low dislocation density region. Further, since the pitch p of the mask layer 20 is 1 mm or more, the semiconductor device can be stably cut out from the low dislocation density region even when the semiconductor device is a high-power light emitting diode or the like, because a chip size of the semiconductor device such as high-power light emitting diodes (LEDs) is 600 μm or more and 1 mm or less.

Since the longer each pitch p of the mask layer 20 is, the better, an upper limit of the pitch p is not limited. However, from a viewpoint of stable pattern formation of the mask layer 20, the pitch p of each of the mask layer 20 is preferably 10 mm or less, for example.

(S200: First Step (First Layer Growth Step))

Figure 2B:
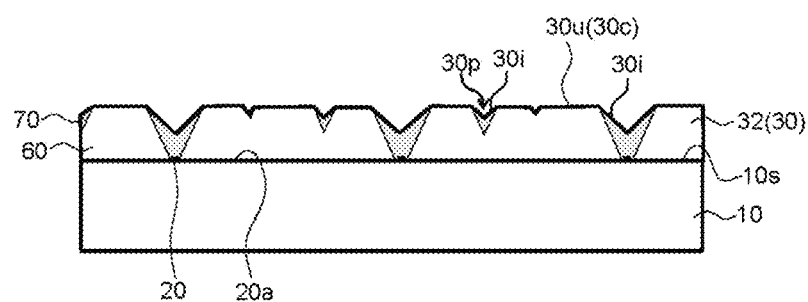
Figure 2C:
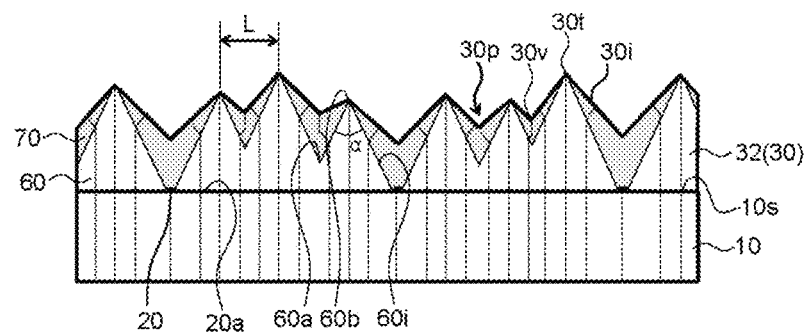

After preparing the base substrate 10, as illustrated in FIGS. 2(b) and 2(c) and FIG. 3, a single crystal of a group III nitride semiconductor having a pair of inclined interfaces 30i other than the c-plane and a top surface 30u sandwiched between the pair of inclined interfaces 30i with the c-plane 30c exposed, is epitaxially grown on the main surface 10s of the base substrate 10. Thereby, a first layer (three-dimensional growth layer) 30 is grown.

At this time, a plurality of concaves 30p formed by being surrounded by the inclined interface 30i other than the c-plane are further generated on the top surface 30u of the single crystal, and the inclined interface 30i is gradually expanded and the c-plane 30c is gradually contracted toward an upper side of the main surface 10s of the base substrate 10. Thereby, the c-plane 30c disappears from the top surface 30u. As a result, the first layer 30 whose surface is composed only of the inclined interface 30i is grown.

That is, in the first step S200, the first layer 30 is three-dimensionally grown so as to intentionally roughen the main surface 10s of the base substrate 10. Even when the first layer 30 is in an appearance of such a growth form, it is grown as a single crystal as described above. In this regard, the first layer 30 is different from a so-called low temperature growth buffer layer formed as an amorphous or polycrystal on a dissimilar substrate before epitaxially growing the group III nitride semiconductor on the dissimilar substrate such as sapphire.

In the present embodiment, for example, a layer comprising the same group III nitride semiconductor as the group III nitride semiconductor constituting the base substrate 10 is epitaxially grown as the first layer 30. Specifically, for example, by heating the base substrate 10 and supplying GaCl gas and NH₃ gas to the heated base substrate 10 by the HVPE method, the GaN layer is epitaxially grown as the first layer 30.

Here, in the first step S200, in order to express the above-described growth process, for example, the first layer 30 is grown under a predetermined first growth condition.

Figure 6A:
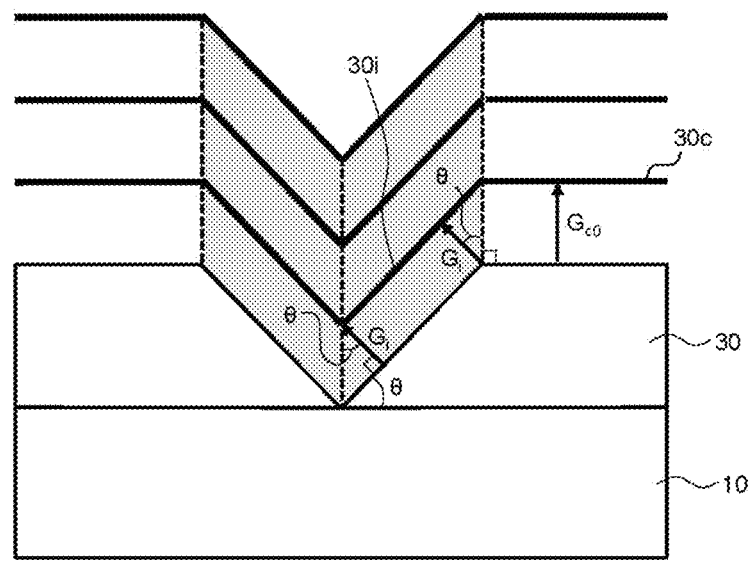
FIG. 6(a) is a schematic cross-sectional view illustrating a growth process under a reference growth condition such that an inclined interface and a c-plane are neither expanded nor contracted, and (b) is a schematic cross-sectional view illustrating a growth process under a first growth condition such that the inclined interface is expanded and the c-plane is contracted.

First, a reference growth condition such that the inclined interface 30i and the c-plane 30c are neither expanded nor contracted, will be described, with reference to FIG. 6(a). FIG. 6(a) is a schematic cross-sectional view illustrating a growth process under the reference growth condition such that the inclined interface and the c-plane are neither expanded nor contracted.

In FIG. 6(a), a thick solid line indicates the surface of the first layer 30 for each unit time. The inclined interface 30i illustrated in FIG. 6(a) is the inclined interface most inclined with respect to the c-plane 30c. Further, in FIG. 6(a), a growth rate of the c-plane 30c of the first layer 30 is $G_{c0}$, a growth rate of the inclined interface 30i of the first layer 30 is and an angle formed by the c-plane 30c and the inclined interface 30i in the first layer 30 is θ. Also, in FIG. 6(a), the first layer 30 grows while maintaining the angle θ formed by the c-plane 30c and the inclined interface 30i. The off-angle of the c-plane 30c of the first layer 30 is negligible as compared with the angle θ formed by the c-plane 30c and the inclined interface 30i.

As illustrated in FIG. 6(a), when each of the inclined interface 30i and the c-plane 30c is neither expanded nor contracted, a locus of an intersection between the inclined interface 30i and the c-plane 30c becomes perpendicular to the c-plane 30c. Therefore, the reference growth condition such that each of the inclined interface 30i and the c-plane 30c is neither expanded nor contracted, satisfies the following formula (a).

$$G_{c0}=/\cos\theta \quad\quad (a)$$

Figure 6B:
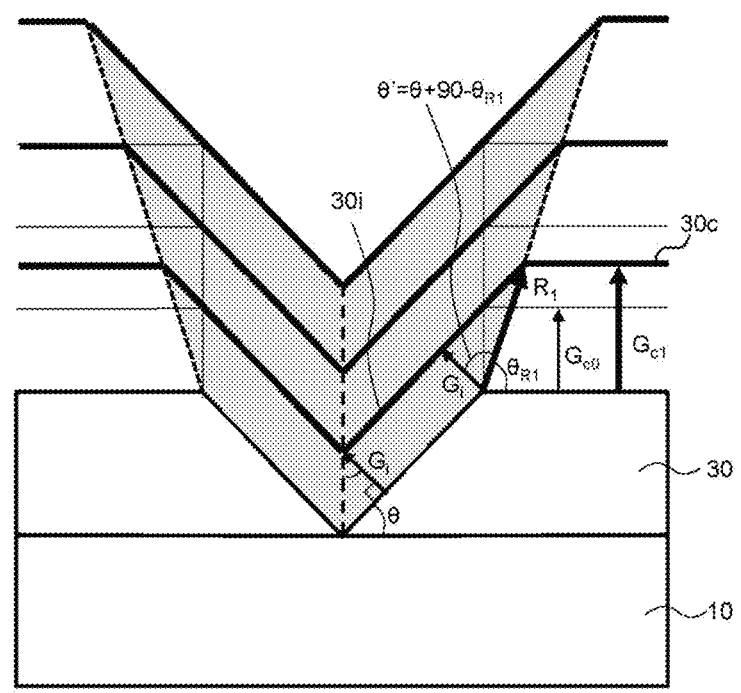

Next, a first growth condition such that the inclined interface 30i is expanded and the c-plane 30c is contracted, will be described with reference to FIG. 6(b). FIG. 6(b) is a schematic cross-sectional view illustrating a growth process under the first growth condition such that the inclined interface is expanded and the c-plane is contracted.

In FIG. 6(b), as in FIG. 6 (a), a thick solid line indicates the surface of the first layer 30 for each unit time. Further, the inclined interface 30i illustrated in FIG. 6(b) is also the inclined interface most inclined with respect to the c-plane 30c. Also, in FIG. 6(b), a growth rate of the c-plane 30c of the first layer 30 is $G_{c1}$, and a progress rate of the locus of the intersection between the inclined interface 30i and the c-plane 30c of the first layer 30 is $R_1$. Further, a narrower angle of the angles formed by the c-plane 30c and the locus of the intersection between the inclined interface 30i and the c-plane 30c, is ORE When the angle formed by $R_1$ direction and $G_i$ direction is θ', θ'=θ+90−$θ_{R1}$ is satisfied. The off-angle of the c-plane 30c of the first layer 30 is negligible as compared with the angle θ formed by the c-plane 30c and the inclined interface 30i.

As illustrated in FIG. 6(b), the progress rate $R_1$ of the locus of the intersection between the inclined interface 30i and the c-plane 30c is represented by the following formula (b).

$$R_1=G_i/\cos\theta' \quad\quad (b)$$

Further, a growth rate $G_{c1}$ of the c-plane 30c of the first layer 30 is represented by the following formula (c).

$$G_{c1}=R_1\sin\theta_{R1} \quad\quad (c)$$

By substituting the formula (b) into the formula (c), $G_{c1}$ is represented by the following formula (d) using $G_i$.

$$G_{c1}=G_i\sin\theta_{R1}/\cos(\theta+90-\theta_{R1}) \quad\quad (d)$$

In order for the inclined interface 30*i* to expand and the c-plane 30*c* to contract, $\theta_{R1}<90°$ is preferable. Accordingly, the first growth condition such that the inclined interface 30*i* is expanded and the c-plane 30*c* is contracted, preferably satisfies the following formula (1), due to satisfying formula (d) and $\theta_{R1}<90°$.

$$G_{c1} > G_i/\cos\theta \qquad (1)$$

Wherein, as described above, Gi is the growth rate of the interface 30*i* most inclined with respect to the c-plane 30*c*, and θ is the angle formed by the inclined interface 30*i* most inclined with respect to the c-plane 30*c*, and the c-plane 30*c*.

Alternatively, it can be considered that $G_{c1}$ based on the first growth condition is preferably larger than $G_{c0}$ based on the reference growth condition. This also derives the formula (1) by substituting the formula (a) into $G_{c1} > G_{c0}$.

Since the growth condition for expanding the inclined interface 30*i* most inclined with respect to the c-plane 30*c* is a strictest condition, it is possible to expand the other inclined interface 30*i* when the first growth condition satisfies the formula (1). Further, as $G_{c1}$ increases with respect to $G_i/\cos\theta$, the inclined interface 30*i* is likely to expanded and the c-plane 30*c* is likely to contracted.

Specifically, for example, when the inclined interface 30*i* most inclined with respect to the c-plane 30*c* is {10-11} plane, θ=61.95° is satisfied. Accordingly, the first growth condition preferably satisfies, for example, the following formula (1').

$$G_{c1} > 2.13 G_i \qquad (1')$$

As the first growth condition of the present embodiment, for example, the growth temperature in the first step S200 is lower than the growth temperature in the second step S300 described later. Specifically, the growth temperature in the first step S200 is, for example, 980° C. or higher and 1,020° C. or lower, preferably 1,000° C. or higher and 1,020° C. or lower.

Further, as the first growth condition of the present embodiment, for example, the ratio of a partial pressure of a flow rate of $NH_3$ gas as a nitride gas to a partial pressure of GaCl gas as a group III source gas (hereinafter, also referred to as "V/III ratio") in the first step S200 may be larger than the V/III ratio in the second step S300 described later. Specifically, the V/III ratio in the first step S200 is, for example, 2 or more and 20 or less, preferably 2 or more and 15 or less.

Actually, as the first growth condition, at least one of the growth temperature and the V/III ratio is adjusted within the above range so as to satisfy the formula (1).

Other conditions of the first growth condition according to the present embodiment are as follows, for example.

Growth pressure: 90 to 105 kPa, preferably 90 to 95 kPa
Partial pressure of GaCl gas: 1.5 to 15 kPa
$N_2$ gas flow rate/$H_2$ gas flow rate: 0 to 1

Here, the first step S200 of the present embodiment is classified into two steps based on, for example, a growing form of the first layer 30. Specifically, the first step S200 of the present embodiment includes, for example, an inclined interface expansion step S220 and an inclined interface maintenance step S240. By these steps, the first layer 30 has, for example, an expanded inclined interface layer 32 and an inclined interface maintaining layer 34.

(S220: Inclined Interface Expansion Step)

First, as illustrated in FIG. 2(*b*) and FIG. 3, the expanded inclined interface layer 32 of the first layer 30 comprising a single crystal of a group III nitride semiconductor is epitaxially grown on the main surface 10*s* of the base substrate 10 exposed in the opening 20*a* of the mask layer 20 under the above-described first growth condition.

In the initial stage of growth of the expanded inclined interface layer 32, the expanded inclined interface layer 32 grows in a normal direction (direction along the c-axis) of the main surface 10*s* of the base substrate 10 with the c-plane 30*c* as a growth surface, immediately on the opening 20*a* of the mask layer 20. On the other hand, crystal growth is suppressed on the mask layer 20. Thereby, the inclined interface 30*i* other than the c-plane is exposed at a position on the mask layer 20 side of the expanded inclined interface layer 32. The pair of inclined interfaces 30*i* are formed so as to face each other with one mask layer 20 interposed therebetween.

The term "inclined interface 30*i*" as used herein means a growth interface inclined with respect to the c-plane 30*c*, and includes low index facets other than the c-plane, high-index facets other than the c-plane, or inclined surfaces that cannot be represented by the surface index. The facets other than the c-plane are, for example, {11-2m}, 11-10n, and the like. Wherein, m and n are integers other than 0.

As described above, by exposing the inclined interface 30*i* at the position on the mask layer 20 side of the expanded inclined interface layer 32, the expanded inclined interface layer 32 is formed in such a manner as having a pair of inclined interfaces 30*i* and a top surface 30*u* sandwiched between the pair of inclined interfaces 30*i* with the c-plane 30*c* exposed.

Further, by gradually growing the expanded inclined interface layer 32 under the first growth condition, as illustrated in FIG. 2(*b*) and FIG. 3, a plurality of concaves 30*p* composed of the inclined interfaces 30*i* other than the c-plane, are formed on the top surface 30*u* of the expanded inclined interface layer 32 with the c-plane 30*c* exposed. The plurality of concaves 30*p* composed of the inclined interfaces 30*i* other than the c-plane are randomly formed on the top surface 30*u*. Thereby, the expanded inclined interface layer 32 is formed, in which the c-plane 30*c* and the inclined interface 30*i* other than the c-plane are mixed on the surface.

Here, similarly to the inclined interface 30*i* formed on the mask layer 20 described above, the inclined interface 30*i* formed on the top surface 30*u* of the expanded inclined interface layer 32 with the c-plane 30*c* exposed, means a growth interface inclined with respect to the c-plane 30*c*.

Then, when the expanded inclined interface layer 32 is further grown under the first growth condition, as illustrated in FIGS. 2 (*b*) and 2 (*c*), a part of the expanded inclined interface layer 32 grows on the mask layer 20 with the inclined interface 30*i* other than the c-plane as a growth surface.

Also, by further growing the expanded inclined interface layer 32 under the first growth condition, as illustrated in FIGS. 2(*b*) and 3 (*c*), the inclined interface 30*i* other than the c-plane is gradually expanded and the c-plane 30*c* is gradually contracted toward the upper side of the base substrate 10, in the expanded inclined interface layer 32. At this time, the inclination angle formed by the inclination interface 30*i* with respect to the main surface 10*s* of the base substrate 10 gradually decreases toward the upper side of the base substrate 10.

When the expanded inclined interface layer 32 is further grown, the c-plane 30*c* of the expanded inclined interface layer 32 disappears from the top surface 30*u*, and the surface of the expanded inclined interface layer 32 is composed only of the inclined interface 30*i*. Thereby, a mountain-like expanded inclined interface layer 32 is formed in the form of continuous connected cones.

In this way, by forming a plurality of concaves 30p composed of the inclined interfaces 30i other than the c-plane on the top surface 30u of the expanded inclined interface layer 32, and making the c-plane 30c disappear, as illustrated in FIG. 2(c), a plurality of valleys 30v and a plurality of tops 30t are formed on the surface of the expanded inclined interface layer 32. Each of the plurality of valleys 30v is formed as an inflection point that is convex downward on the surface of the expanded inclined interface layer 32, and is formed at the upper part of a position where each of the inclined interfaces 30i other than the c-plane is generated. On the other hand, each of the plurality of tops 30t is formed as an inflection point that is convex upward on the surface of the expanded inclined interface layer 32, and is formed at a position where the c-plane 30c (finally) disappears and terminates or at the upper part of this position, between a pair of inclined interfaces 30i that expand in opposite directions. The valleys 30v and the tops 30t are formed alternately in a direction along the main surface 10s of the base substrate 10. The plurality of valleys 30v also include valleys composed of a pair of inclined interfaces 30i at the upper side of the mask layer 20.

In the present embodiment, for example, a plurality of valleys 30v and a plurality of tops 30t are formed at the upper side of the openings 20a of the mask layer 20 by forming a plurality of concaves 30p composed of the inclined interfaces 30i other than the c-plane on the top surface 30u of the expanded inclined interface layer 32 grown at the upper side of the openings 20a of the mask layer 20. In other words, at least one valley 30v and a plurality of tops 30t are formed at the upper side of each of the plurality of openings 20a of the mask layer 20. Thereby, a height from the main surface 10s of the base substrate 10 to the top 30t can be more lowered than a height in the case of forming a large substantially triangular columnar three-dimensional growth layer having only one top at the upper side of the openings of the mask. As a result, the surface of a second layer 40, which will be described later, can be quickly mirror-finished.

Further, in the present embodiment, in the initial stage of growth of the expanded inclined interface layer 32, the expanded inclined interface layer 32 is grown to a predetermined thickness immediately on the opening 20a of the mask layer 20, with the c-plane 30c as a growth surface without generating the inclined interfaces 30i, then, the inclined interfaces 30i other than the c-plane are generated on the surface of the expanded inclined interface layer 32. Thereby, the plurality of valleys 30v formed at the upper side of the openings 20a of the mask layer 20, are formed at positions separated upward from the main surface 10s of the base substrate 10.

Due to the growth process of the expanded inclined interface layer 32 as described above, dislocations are bent and propagated as follows. Specifically, as illustrated in FIG. 2(c), a part of the plurality of dislocations are blocked by the mask layer 20 to suppress propagation to the inclined interface expansion layer 32. Meanwhile, the other part of the plurality of dislocations extending in the direction along the c-axis in the base substrate 10 propagates from the base substrate 10 through the openings 20a of the mask layer 20 in the direction along the c-axis of the expanded inclined interface layer 32. In a region of the expanded inclined interface layer 32 that has grown with the c-plane 30c as a growth surface, the dislocations propagate from the base substrate 10 in the direction along the c-axis of the expanded inclined interface layer 32. However, when the dislocations propagated in the direction along the c-axis of the expanded inclined interface layer 32 are exposed to the inclined interface 30i, the dislocations are bent and propagate in a direction substantially perpendicular to the inclined interface 30i at a position where the inclined interface 30i is exposed. That is, the dislocations are bent and propagate in a direction inclined with respect to the c-axis. Thereby, in the steps after the inclined interface expansion step S220, the dislocations are locally collected in the upper part of the substantially center between the pair of tops 30t. As a result, a dislocation density in the surface of a second layer 40, which will be described later, can be lowered.

At this time, in the present embodiment, observation of an arbitrary cross section perpendicular to the main surface 10s of the base substrate 10 reveals that an average distance between a pair of tops separated in a direction along the main surface (also called "an average distance between closest tops") L is, for example, more than 100 μm, the pair of tops being closest to each other among the plurality of tops, with one valley sandwiched between them. When the average distance L between the closest tops is 100 μm or less, as in the case where fine hexagonal pyramid-shaped crystal nuclei are generated on the main surface 10s of the base substrate 10 from the initial stage of the inclined interface expansion step S220, the distance in which dislocations are bent and propagated is shortened in the steps after the inclined interface expansion step S220. Therefore, the dislocations are not sufficiently collected in the upper part of the substantially center between the pair of tops 30t of the expanded inclined interface layer 32. As a result, the dislocation density in the surface of the second layer 40, which will be described later, may not be sufficiently lowered. In contrast, in the present embodiment, since the average distance L between the closest tops is more than 100 at least over 50 μm of the distance in which the dislocations are bent and propagated can be secured in the steps after the inclined interface expansion step S220. Thereby, the dislocations can be sufficiently collected in the upper part of the substantially center between the pair of tops 30t of the expanded inclined interface layer 32. As a result, the dislocation density in the surface of the second layer 40, which will be described later, can be sufficiently lowered. In the present embodiment, it is particularly preferable that the average distance L between the closest tops is more than 100 μm at the upper side of the openings 20a of the mask layer 20.

On the other hand, in the present embodiment, the average distance L between the closest tops is less than 800 When the average distance L between the closest tops is 800 μm or more, a height from the valley 30v to the top 30t of the expanded inclined interface layer 32 on the main surface 10s of the base substrate 10 becomes excessively high. Therefore, a thickness of the second layer 40 until it is mirror-finished (it becomes a mirror surface), becomes thicker in the second step S300, which will be described later. In contrast, in the present embodiment, since the average distance L between the closest tops is less than 800 the height from the valley 30v to the top 30t of the expanded inclined interface layer 32 on the main surface 10s of the base substrate 10 can be lowered. Thereby, the second layer 40 can be quickly mirror-finished in the second step S300 described later.

Further, at this time, a first c-plane growth region 60 grown with the c-plane 30c as a growth surface and an inclined interface growth region 70 (gray part in the figure) grown with the inclined interface 30i other than the c-plane as a growth surface, are formed on the expanded inclined interface layer 320, based on a difference in growth surfaces during the growth process.

Further, at this time, in the first c-plane growth region 60, a valley 60a is formed at a position where the inclined interface 30i is generated, and a mountain 60b is formed at a position where the c-plane 30c disappears. Further, in the first c-plane growth region 60, a pair of inclined portions 60i are formed on both sides of the mountain 60b, as a locus of an intersection between the c-plane 30c and the inclined interface 30i.

Further, at this time, when the first growth condition satisfies the formula (1), an angle α formed by the pair of inclined portions 60i is, for example, 70° or less.

Details of these regions will be described later.

(S240: Inclined Interface Maintenance Step)

Figure 4A:
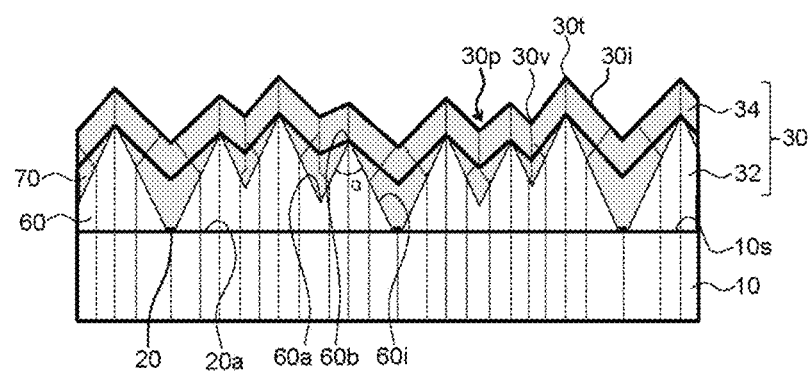
FIGS. 4(a) to (b) are schematic perspective views illustrating a part of a method for manufacturing a nitride semiconductor substrate according to an embodiment of the present disclosure.

After the c-plane 30c disappears from the surface of the expanded inclined interface layer 32, as illustrated in FIG. 4(a), the growth of the first layer 30 over a predetermined thickness is continued while maintaining a state where the inclined interface 30i occupies more than the c-plane 30c on the surface, preferably a state where the surface is composed only of the inclined interface 30i. Thereby, an inclined interface maintenance layer 34 having a surface in which the inclined interface 30i occupies more than the c-plane 30c, is formed on the expanded inclined interface layer 32. Since the inclined interface maintenance layer 34 is formed, the c-plane 30c can reliably disappear over the entire surface of the first layer 30.

At this time, the c-plane 30c may reappear in a part of the surface of the inclined interface maintenance layer 34, but it is preferable to mainly expose the inclined interface 30i on the surface of the inclined interface maintenance layer 34, so that an area ratio of the inclined interface growth region 70 is 80% or more in a creepage cross section along the main surface 10s of the base substrate 10. The higher the area ratio occupied by the inclined interface growth region 70 in the creepage cross section, the better, and it is preferable that the area ratio is 100%.

At this time, the growth condition in the inclined interface maintenance step S240 is maintained under the above-described first growth condition in the same manner as in the inclined interface expansion step S220. Thereby, the inclined interface maintenance layer 34 can grow, with only the inclined interface 30i as a growth surface.

Further, at this time, by growing the inclined interface maintenance layer 34 with the inclined interface 30i as a growth surface under the first growth condition, as described above, the dislocations that bend and propagate in the direction inclined with respect to the c-axis at the position where the inclined interface 30i is exposed in the inclined interface expanding layer 32, continue to propagate in the same direction in the inclined interface maintenance layer 34.

Further, at this time, the inclined interface maintenance layer 34 grows with the inclined interface 30i as a growth surface, so that the entire inclined interface maintenance layer 34 becomes a part of the inclined interface growth region 70.

By the above first step S200, the first layer 30 having the expanded inclined interface layer 32 and the inclined interface maintenance layer 34, is formed.

In the first step S200 of the present embodiment, a height from the main surface 10s of the base substrate 10 to the top 30t of the first layer 30 (a maximum height in a thickness direction of the first layer 30) is, for example, more than 100 µm and less than 1.5 mm.

(S300: Second Step (Second Layer Growth Step))

Figure 4B:
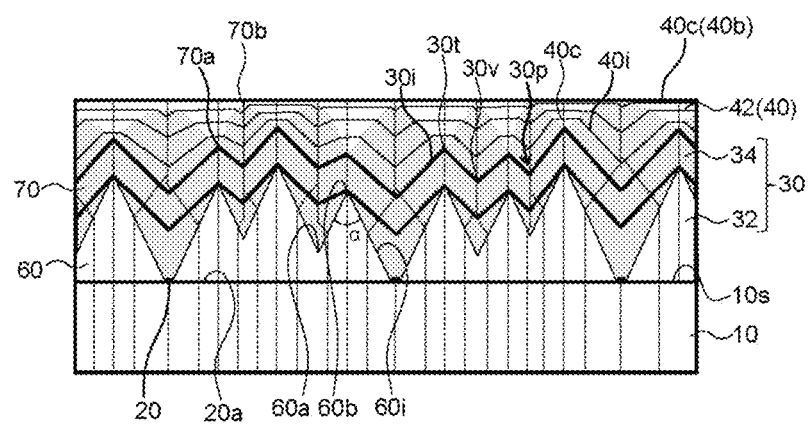
Figure 5A:
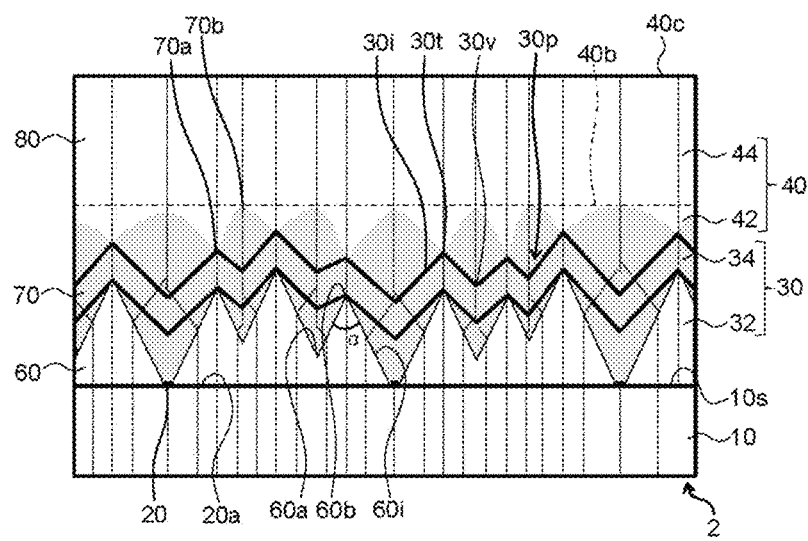
FIGS. 5(a) to 5(b) are schematic cross-sectional views illustrating a part of a method for manufacturing a nitride semiconductor substrate according to an embodiment of the present disclosure.

After the first layer 30 in which the c-plane 30c has disappeared is grown, a single crystal of a group III nitride semiconductor is further epitaxially grown on the first layer 30 as illustrated in FIGS. 4(b) and 5(a).

At this time, the inclined interface 40i is gradually contracted and the c-plane 40c is gradually expanded toward the upper side of the main surface 10s of the base substrate 10. Thereby, the inclined interface 30i formed on the surface of the first layer 30 disappears. As a result, a second layer (flattening layer) 40 having a mirror surface is grown. The "mirror surface" herein means a surface in which a maximum height difference of the unevenness of the surface is equal to or less than a wavelength of a visible light.

In the present embodiment, for example, a layer is epitaxially grown as the second layer 40, containing the same group III nitride semiconductor as the group III nitride semiconductor constituting the first layer 30 as a main component. In the second step S300, a silicon (Si)-doped GaN layer is epitaxially grown as the second layer 40, by supplying GaCl gas, $NH_3$ gas and dichlorosilane ($SiH_2Cl_2$) gas as an n-type dopant gas to the base substrate 10 heated to a predetermined growth temperature. As the n-type dopant gas, $GeCl_4$ gas or the like may be supplied instead of the $SiH_2Cl_2$ gas.

Here, in the second step S300, in order to express the above-described growth process, for example, the second layer 40 is grown under a predetermined second growth condition.

Figure 7:
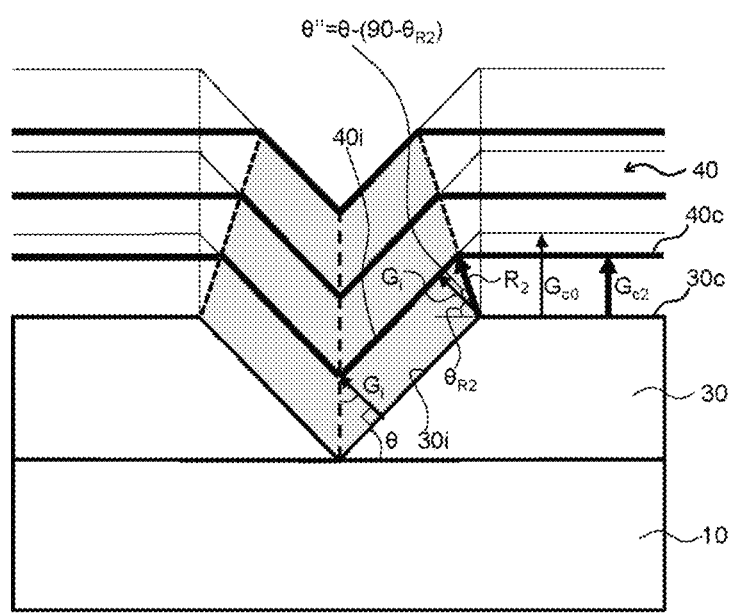
FIG. 7 is a schematic cross-sectional view illustrating a growth process under a second growth condition such that the inclined interface is contracted and the c-plane is expanded.

The second growth condition such that the inclined interface 40i is contracted and the c-plane 40c is expanded, will be described with reference to FIG. 7. FIG. 7 is a schematic cross-sectional view illustrating a growth process under the second growth condition such that the inclined interface is contracted and the c-plane is expanded. FIG. 7 illustrates a process of growing the second layer 40 on the first layer 30 where the inclined interface 30i is exposed, the inclined interface 30i being most inclined with respect to the c-plane 30c.

In FIG. 7, as in FIG. 6(a), the thick solid line indicates the surface of the second layer 40 for each unit time. Further, in FIG. 7, a growth rate of the c-plane 40c of the second layer 40 is $G_{c2}$, a growth rate of the inclined interface 40i of the second layer 40 is and a progress rate of the locus of the intersection between the inclined interface 40i and the c-plane 40c in the second layer 40, is $R_2$. Further, a narrower angle of the angles formed by the c-plane 30c and the locus of the intersection between the inclined interface 40i and the c-plane 40c, is $\theta_{R2}$. When an angle formed by $R_2$ direction and Gi direction is θ ", θ"=θ−(90−$\theta_{R2}$) is satisfied. Further, in FIG. 7, the second layer 40 grows while maintaining the angle θ formed by the c-plane 30c and the inclined interface 30i in the first layer 30. The off-angle of the c-plane 40c of the second layer 40 is negligible as compared with the angle θ formed by the c-plane 30c and the inclined interface 30i.

As illustrated in FIG. 7, the progress rate $R_2$ of the locus of the intersection between the inclined interface 40i and the c-plane 40c, is represented by the following formula (e).

$$R_2 = G_i / \cos \theta'' \tag{e}$$

Further, the growth rate $G_{c2}$ of the c-plane 40c of the second layer 40 is represented by the following formula (f).

$$G_{c2} = R_2 \sin \theta_{R2} \tag{f}$$

By substituting the formula (e) into the formula (f), $G_{c2}$ is represented by the following formula (g) using $G_i$.

$$G_{c2} = G_i \sin \theta_{R2} / \cos(\theta + \theta_{R2} - 90) \tag{g}$$

In order for the inclined interface 40i to contract and the c-plane 40c to expand, it is preferable that $\theta_{R2}<90°$ is satisfied. Accordingly, the second growth condition such that the inclined interface 40i is contracted and the c-plane 40c is expanded, preferably satisfies the following formula (2), du to satisfying the formula (g) and $\theta_{R2}<90°$.

$$G_{c2}<G_i/\cos\theta \quad (2)$$

wherein, as described above, $G_i$ is the growth rate of the inclined interface 40i most inclined with respect to the c-plane 40c, and $\theta$ is the angle formed by the c-plane 40c and the inclined interface 40i most inclined with respect to the c-plane 40c.

Alternatively, when the growth rate of the c-plane 30c of the second layer 40 under the reference growth condition is $G_{c0}$, it can also be considered that $G_{c2}$ under the second growth condition is preferably smaller than $G_{c0}$ under the reference growth condition. From this as well, the formula (2) can be derived by substituting the formula (a) into $G_{c2}<G_{c0}$.

When the second growth condition satisfies the formula (2), the other inclined interface 40i can also be contracted, because the growth condition for contracting the interface 40i most inclined with respect to the c-plane 40c, is a strictest condition.

Specifically, when the inclined interface 40i most inclined with respect to the c-plane 40c is the {10-11} plane, the second growth condition preferably satisfies the following formula (2').

$$G_{c2}<2.13G_i \quad (2')$$

As the second growth condition of the present embodiment, the growth temperature in the second step S300 is set higher than, for example, the growth temperature in the first step S200. Specifically, the growth temperature in the second step S300 is, for example, 990° C. or higher and 1,120° C. or lower, preferably 1,020° C. or higher and 1,100° C. or lower.

Further, as the second growth condition of the present embodiment, the V/III ratio in the second step S300 may be adjusted. For example, the V/III ratio in the second step S300 may be smaller than the V/III ratio in the first step S200. Specifically, the V/III ratio in the second step S300 is, for example, 1 or more and 10 or less, preferably 1 or more and 5 or less.

Actually, as the second growth condition, at least one of the growth temperature and the V/III ratio is adjusted within the above range so as to satisfy the formula (2).

Other conditions of the second growth condition of the present embodiment are, for example, as follows.
Growth pressure: 90 to 105 kPa, preferably 90 to 95 kPa
Partial pressure of GaCl gas: 1.5 to 15 kPa
$N_2$ gas flow rate/$H_2$ gas flow rate: 1 to 20

Here, the second step S300 of the present embodiment is classified into two steps based on, for example, a growing form of the second layer 40. Specifically, the second step S300 of the present embodiment includes, for example, a c-plane expansion step S320 and a main growth step S340. By these steps, the second layer 40 has, for example, a c-plane expanded layer 42 and a main growth layer 44.

(S320: c-Plane Expansion Step)

As illustrated in FIG. 4(b), the c-plane expanded layer 42 of the second layer 40 comprising a single crystal of a group III nitride semiconductor is epitaxially grown on the first layer 30 under the above-described second growth condition.

At this time, the c-plane 40c is expanded and the inclined interface 40i other than the c-plane is contracted, toward an upper side of the first layer 30.

Specifically, due to the growth under the second growth condition, the c-plane expanded layer 42 grows from the inclined interface 30i of the inclined interface maintaining layer 34 in a direction perpendicular to the c-axis (that is, a creepage direction or a lateral direction) with the inclined interface 40i as a growth surface. When the c-plane expanded layer 42 is grown laterally, the c-plane 40c of the c-plane expanded layer 42 begins to be exposed again in the upper part of the top 30t of the inclined interface maintenance layer 34. Thereby, the c-plane expanded layer 42 is formed, in which the c-plane 40c and the inclined interface 40i other than the c-plane are mixed on the surface.

When the c-plane expanded layer 42 is further grown laterally, the c-plane 40c gradually expands, and the inclined interface 40i of the c-plane expanded layer 42 gradually contracts. Thereby, the concaves 30p formed by the plurality of inclined interfaces 30i are gradually embedded in the surface of the first layer 30.

Thereafter, when the c-plane expanded layer 42 is further grown, the inclined interface 40i of the c-plane expanded layer 42 disappears completely, and the concaves 30p composed of the plurality of inclined interfaces 30i on the surface of the first layer 30 are completely embedded. Thereby, the surface of the c-plane expanded layer 42 becomes a mirror surface (flat surface) composed only of the c-plane 40c.

At this time, the dislocation density can be lowered by locally collecting dislocations during the growth process of the first layer 30 and the c-plane expanded layer 42. Specifically, the dislocations that bend and propagate in the direction inclined with respect to the c-axis in the first layer 30 continue to propagate in the same direction in the c-plane expanded layer 42. Thereby, the dislocations are collected locally at a meeting part of the adjacent inclined interfaces 40i in the upper part of the center of the c-plane expanded layer 42 between the pair of tops 30t. Of the plurality of dislocations collected at the meeting part of the adjacent inclined interface 40i of the c-plane expanded layer 42, the dislocations having Burgers vectors opposite to each other, disappear at the meeting. Further, some of the dislocations collected at the meeting part of the adjacent inclined interfaces 40i form a loop, and the propagation in the direction along the c-axis (that is, toward the surface side of the c-plane expanded layer 42) is suppressed. The other part of the plurality of dislocations collected at the meeting part of the adjacent inclined interfaces 40i of the c-plane expanded layer 42, changes its propagation direction again from the direction inclined with respect to the c-axis to the direction along the c-axis, and propagates to the surface side of the second layer 40. In this way, by making some of the plurality of dislocations disappear and suppressing the propagation of some of the plurality of dislocations to the surface side of the c-plane expanded layer 42, the dislocation density in the surface of the second layer 40 can be lowered. Further, by collecting the dislocations locally, a low dislocation density region can be formed in the upper side of a portion of the second layer 40 in which the dislocations propagate in the direction inclined with respect to the c-axis.

Further, at this time, since the c-plane 40c gradually expands in the c-plane expanded layer 42, a second c-plane growth region 80 that has grown with the c-plane 40c as a growth surface, which will be described later, is formed while gradually expanding toward the upper side in the thickness direction.

On the other hand, in the c-plane expanded layer 42, as the inclined interface 40i gradually contracts, the inclined interface growth region 70 gradually contracts toward the upper side in the thickness direction, and terminates at a predetermined position in the thickness direction. Due to the growth process of the c-plane expanded layer 42 as described above, the valley 70a of the inclined interface growth region 70 is formed at a position where the c-plane 40c is generated again, in a cross-sectional view. Further, in the process of gradually embedding the concave formed by the inclined interface 40i, a mountain 70b of the inclined interface growth region 70 is formed at a position where the inclined interface 40i disappears, in a cross-sectional view.

In the c-plane expansion step S320, the surface of the c-plane expanded layer 42 is a mirror surface composed only of the c-plane 40c, and therefore the height of the c-plane expanded layer 42 in the thickness direction (maximum height in the thickness direction) is, for example, greater than or equal to the height from the valley 30v to the top 30t of the inclined interface maintenance layer 34.

(S340: Main Growth Step (c-Plane Growth Step))

When the inclined interface 40i disappears in the c-plane expanded layer 42 and the surface is mirror-finished, as illustrated in FIG. 5(a), a main growth layer 44 is formed on the c-plane expanded layer 42 over a predetermined thickness with the c-plane 40c as a growth surface. Thereby, the main growth layer 44 having only the c-plane 40c on the surface without having the inclined interface 40i, is formed.

At this time, the growth condition in the main growth step S340 is maintained under the above-described second growth condition, in the same manner as in the c-plane expansion step S320. Thereby, the main growth layer 44 can be step-flow-grown with the c-plane 40c as a growth surface.

Further, at this time, by growing the main growth layer 44 with only the c-plane 40c as a growth surface without exposing the inclined interface 40i, a second c-plane growth region 80, which will be described later, is formed over an entire growth layer 44.

In the main growth step S340, a thickness of the main growth layer 44 is, for example, 300 µm or more and 10 mm or less. Since the thickness of the main growth layer 44 is 300 µm or more, at least one or more substrates 1 can be sliced from the main growth layer 44 in the slicing step S400 described later. On the other hand, since the thickness of the main growth layer 44 is 10 mm, at least ten substrates 1 can be obtained when a final thickness is 650 µm, and 700 µm-thick substrate 1 is sliced from the main growth layer 44, even when the karfloss of about 200 µm is taken into consideration.

By the above second step S300, the second layer 40 having the c-plane expanded layer 42 and the main growth layer 44 is formed. As a result, a laminated structure 2 of the present embodiment is formed.

The above steps from the first step S200 to the second step S300, are continuously performed in the same chamber without exposing the base substrate 10 to the atmosphere. Thereby, it is possible to suppress a formation of an unintended high oxygen concentration region (a region having an oxygen concentration excessively higher than the inclined interface growth region 70), at an interface between the first layer 30 and the second layer 40.

(S400: Slicing Step)

Figure 5B:
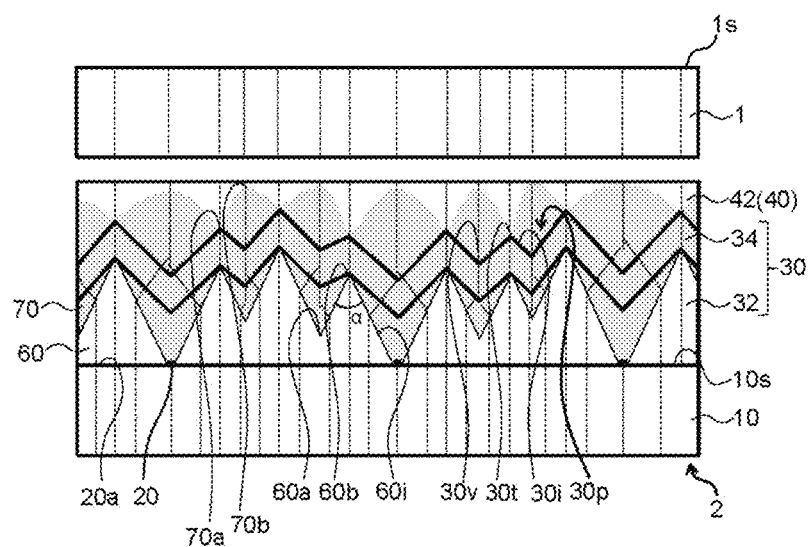

Next, as illustrated in FIG. 5(b), for example, the main growth layer 44 is sliced by a wire saw along a cut surface substantially parallel to the surface of the main growth layer 44. Thereby, at least one nitride semiconductor substrate 1 (also referred to as a substrate 1) as an as-sliced substrate is formed. At this time, the thickness of the substrate 1 is, for example, 300 µm or more and 700 µm or less.

(S500: Polishing Step)

Next, both sides of the substrate 1 are polished by a polishing device. At this time, the thickness of the final substrate 1 is, for example, 250 µm or more and 650 µm or less.

The substrate 1 according to the present embodiment is manufactured by the above steps S100 to S500.

(A Step of Preparing a Semiconductor Laminate and a Step of Preparing a Semiconductor Device)

After the substrate 1 is manufactured, for example, a semiconductor functional layer including a group III nitride semiconductor is epitaxially grown on the substrate 1 to prepare a semiconductor laminate. After the semiconductor laminate is prepared, an electrode or the like is formed using the semiconductor laminate, and the semiconductor laminate is diced, and a chip having a predetermined size is cut out. Thereby, a semiconductor device is prepared.

(2) Laminated Structure

Next, a laminated structure 2 according to the present embodiment will be described with reference to FIG. 5(a).

The laminated structure 2 of the present embodiment has, for example, the base substrate 10, the mask layer 20, the first layer 30, and the second layer 40.

The mask layer 20 is provided on the main surface 10s of the base substrate 10 and has predetermined openings 20a. A plurality of openings 20a of the mask layer 20 are provided, for example, in a striped shape. Each pitch p of the mask layer 20 is, for example, 800 µm or more.

The first layer 30 grows on the main surface 10s of the base substrate 10 through the openings 20a of the mask layer 20, for example.

The first layer 30 has, for example, a plurality of valleys 30v and a plurality of tops 30t on the top surface 30u of a single crystal of a group III nitride semiconductor, the valleys 30v and tops 30t being formed by forming a plurality of concaves 30p composed of the inclined interfaces 30i other than the c-plane and making the c-plane 30c disappear. The first layer 30 has, for example, a plurality of valleys 30v and a plurality of tops 30t at the upper side of the openings 20a of the mask layer 20. In other words, the first layer 30 has, for example, at least one valley 30v and a plurality of tops 30t at the upper side of each of the plurality of openings 20a of the mask layer 20. Observation of an arbitrary cross section perpendicular to the main surface of the base substrate 10, reveals that an average distance L between the closest tops is, for example, more than 100 µm.

Further, the first layer 30 includes, for example, a first c-plane growth region (first low oxygen concentration region) 60 and an inclined interface growth region (high oxygen concentration region) 70 based on a difference of the growth surface in the growth process.

The first c-plane growth region 60 is a region that has grown with the c-plane 30c as a growth surface. The first c-plane growth region 60 has, for example, a plurality of valleys 60a and a plurality of mountains 60b in a cross-sectional view. Each of the valleys 60a and the mountains 60b referred to herein, means a part of a shape observed based on the difference of emission intensity when the cross section of the laminated structure 2 is observed with a fluorescence microscope or the like, and does not mean a part of an outermost surface shape generated during the growth of the first layer 30. Each of the plurality of valleys 60a is an inflection point that is convex downward in the first c-plane growth region 60 in a cross-sectional view, and is formed at a position where the inclined interface 30i is generated. At least one valley 60a is provided at a position separated upward from the main surface 10s of the base substrate 10. On the other hand, each of the plurality of mountains 60b is an inflection point that is convex upward in the first c-plane growth region 60 in a cross-sectional view, and is formed at a position where the c-plane 30c disappears (finally) and terminates, between a pair of inclined interfaces 30i that expand in opposite directions. The valleys 60a and the mountains 60b are formed alternately in a direction along the main surface 10s of the base substrate 10.

Observation of an arbitrary cross section perpendicular to the main surface 10s of the base substrate 10 reveals that, an average distance between the pair of mountains 60b separated in the direction along the main surface 10s of the substrate 10 corresponds to an average distance L between the closest tops of the first layer 30 described above, and is, for example, more than 100 the pair of mountains 60b being closest to each other among the plurality of mountains 60b, with one valley 60a sandwiched between them.

The first c-plane growth region 60 has a pair of inclined portions 60i provided as a locus of an intersection between the c-plane 30c and the inclined interface 30i, on both sides interposing one of the plurality of mountains 60b. The inclined portion 60i referred to herein means a part of the shape observed based on the difference of emission intensity when the cross section of the laminated structure 2 is observed with a fluorescence microscope or the like, and does not mean the inclined interface 30i on the outermost surface that generates during the growth of the first layer 30.

An angle α formed by the pair of inclined portions 60i is, for example, 70° or less, preferably 20° or more and 65° or less, in a cross-sectional view.

The above matter: the angle α formed by the pair of inclined portions 60i is 70° or less, means that the ratio $G_{c1}/G_i$ is high, which is the ratio of the growth rate $G_{c1}$ of the c-plane 30c of the first layer 30 to the growth rate $G_i$ of the inclined interface 30i most inclined with respect to the c-plane 30c of the first layer 30. Thereby, the inclined interface 30i other than the c-plane can be easily generated. As a result, the dislocations can be easily bent at a position where the inclined interface 30i is exposed. Further, since the angle α formed by the pair of inclined portions 60i is 70° or less, a plurality of valleys 30v and a plurality of tops 30t can be easily generated at the upper side of the openings 20a of the mask layer 20. Further, since the angle α formed by the pair of inclined portions 60i is 65° or less, the inclined interface 30i other than the c-plane can be more easily generated, and a plurality of valleys 30v and a plurality of tops 30t can be more easily generated at the upper side of the openings 20a of the mask layer 20. Also, since the angle α formed by the pair of inclined portions 60i is 20° or more, the height from the valley 30v to the top 30t of the first layer 30 is prevented from increasing, and the thickness until the second layer 40 is mirror-finished, is prevented from increasing.

On the other hand, the inclined interface growth region 70 is a region grown with the inclined interface 30i other than the c-plane as a growth surface. A lower surface of the inclined interface growth region 70 is formed, for example, following the shape of the first c-plane growth region 60. The inclined interface growth region 70 is continuously provided along the main surface of the base substrate 10.

In the inclined interface growth region 70, oxygen is easily taken in as compared with the first c-plane growth region 60. Therefore, the oxygen concentration in the inclined interface growth region 70 is higher than the oxygen concentration in the first c-plane growth region 60. The oxygen taken into the inclined interface growth region 70, is, for example, the oxygen unintentionally mixed in a vapor phase growth apparatus, or the oxygen released from a member (quartz member or the like) constituting the vapor phase growth apparatus, or the like.

The oxygen concentration in the first c-plane growth region 60 is, for example, $5\times10^{16}$ cm$^{-3}$ or less, preferably $3\times10^{16}$ cm$^{-3}$ or less, and specifically, it is $2\times10^{16}$ cm$^{-3}$ or less. On the other hand, the oxygen concentration in the inclined interface growth region 70 is, for example, $9\times10^{17}$ cm$^{-3}$ or more and $5\times10^{19}$ cm$^{-3}$ or less.

The second layer 40 has, for example, the inclined interface growth region (high oxygen concentration region) 70 and the second c-plane growth region (second low oxygen concentration region) 80 based on a difference of the growth surface in the growth process.

The top surface of the inclined interface growth region 70 in the second layer 40 has, for example, a plurality of valleys 70a and a plurality of mountains 70b in a cross-sectional view. Each of the valleys 70a and the mountains 70b referred to herein, means a part of the shape observed based on the difference of emission intensity when the cross section of the laminated structure 2 is observed with a fluorescence microscope or the like, and does not mean a part of the outermost surface shape that generates during the growth of the second layer 40. As described above, the plurality of valleys 70a of the inclined interface growth region 70 are formed at positions where the c-plane 40c is generated again, in the cross-sectional view. Further, the plurality of valleys 70a of the inclined interface growth region 70 are formed at the upper part of the plurality of mountains 60b of the first c-plane growth region 60, respectively, in a cross-sectional view. On the other hand, as described above, the plurality of mountains 70b of the inclined interface growth region 70 are formed respectively at a position where the inclined interface 40i disappears and terminates, in a cross-sectional view. Further, the plurality of mountains 70b of the inclined interface growth region 70 are formed at the upper part of the plurality of valleys 60a of the first c-plane growth region 60, respectively, in a cross-sectional view.

Further, a surface of the second layer 40, which is substantially parallel to the main surface 10s of the base substrate 10 at an upper end of the inclined interface growth region 70 is formed as a boundary surface 40b at a position where the inclined interface 40i of the second layer 40 disappears and terminates.

The second c-plane growth region 80 is a region that has grown with the c-plane 40c as a growth surface. In the second c-plane growth region 80, oxygen uptake is suppressed as compared with the inclined interface growth region 70. Therefore, the oxygen concentration in the second c-plane growth region 80 is lower than the oxygen concentration in the inclined interface growth region 70. The oxygen concentration in the second c-plane growth region 80 is, for example, $5\times10^{16}$ cm$^{-3}$ or less, preferably $3\times10^{16}$ cm$^{-3}$ or less.

In the present embodiment, in the growth process of the first layer 30, the dislocations bend and propagate in a direction substantially perpendicular to the inclined interface 30i at a position where the inclined interface 30i other than the c-plane is exposed. Thereby, in the second layer 40, some of the plurality of dislocations disappear, and some of the plurality of dislocations are suppressed from propagating to the surface side of the c-plane expanded layer 42. Thereby, the dislocation density in the surface of the second layer 40 is lower than the dislocation density in the main surface 10s of the base substrate 10.

Further, in the present embodiment, the dislocation density in the surface of the second layer 40 is sharply reduced in a thickness direction.

Here, the dislocation density in the main surface 10s of the base substrate 10 is $N_0$, and the dislocation density within a low dislocation density region (eg 250 µm square) in the boundary surface 40b at the position where the inclined interface 40i disappears in the second layer 40, is N. Also, an average dislocation density in the boundary surface 40b is N. On the other hand, when the crystal layer of a group III nitride semiconductor is epitaxially grown on the main surface 10s of the base substrate 10 to a thickness equal to the thickness from the main surface to the boundary surface 40b of the base substrate 10 of the present embodiment, with only the c-plane as a growth surface (hereinafter, it is also referred to as "in the case of c-plane limited growth"), the dislocation density in the surface of the crystal layer is N'.

In the case of the c-plane limited growth, the dislocation density in the surface of the crystal layer tended to be inversely proportional to the thickness of the crystal layer. Specifically, in the case of the c-plane limited growth, when the thickness of the crystal layer is 1.5 mm, a reduction rate of the dislocation density obtained by $N'/N_0$ is about 0.6.

In contrast, in the present embodiment, the reduction rate of the dislocation density obtained by $N/N_0$ is smaller than, for example, the reduction rate of the dislocation density obtained by N'/No in the case of the c-plane limited growth.

Specifically, in the present embodiment, the thickness of the boundary surface 40b at the position where the inclined interface 40i disappears in the second layer 40 from the main surface 10s of the base substrate 10 is, for example, 1.5 mm or less, preferably 1.2 mm or less. Further, in the present embodiment, the reduction rate of the dislocation density obtained by $N/N_0$ described above is, for example, 0.3 or less, preferably 0.23 or less.

In the present embodiment, a lower limit of the thickness of the base substrate 10 from the main surface 10s to the boundary surface 40b is not limited, because the thinner, the better. However, in the first step S200 and the second step S300, the thickness of the base substrate 10 from the main surface 10s to the boundary surface 40b is, for example, more than 200 in consideration of the process from the generation of the inclined interface 30i to the disappearance of the inclined interface 40i.

Further, in the present embodiment, a lower limit of the reduction rate of the dislocation density is not limited, because the smaller, the better. However, the reduction rate of the dislocation density is, for example, 0.01 or more, in consideration of the matter that the thickness from the main surface 10s of the base substrate 10 to the boundary surface 40b is 1.5 mm or less.

In addition, in the present embodiment, an entire surface of the second layer 40 is composed of +c plane, and the first layer 30 and the second layer 40 do not include a polarity reversal zone (inversion domain), respectively. In this respect, the laminated structure 2 of the present embodiment is different from a laminated structure formed by a so-called DEEP (Dislocation Elimination by the Epitaxial-growth with inverse-pyramidal Pits) method, that is, different from a laminated structure including the polarity reversal zone in a core located in the center of a pit.

(3) Nitride Semiconductor Substrate (Nitride Semiconductor Free-Standing Substrate, Nitride Crystal Substrate)

Next, a nitride semiconductor substrate 1 according to the present embodiment will be described.

In the present embodiment, the substrate 1 obtained by slicing the second layer 40 by the above-described manufacturing method is, for example, a free-standing substrate comprising a single crystal of a group III nitride semiconductor. In the present embodiment, the substrate 1 is, for example, a GaN free-standing substrate.

A diameter of the substrate 1 is, for example, 2 inches or more. A thickness of the substrate 1 is, for example, 300 µm or more and 1 mm or less.

A conductivity of the substrate 1 is not particularly limited, but when manufacturing a semiconductor device as a vertical Schottky barrier diode (SBD) using the substrate 1, the substrate 1 is, for example, n-type, and n-type impurities in the substrate 1 are, for example, Si or germanium (Ge), and n-type impurities concentration in the substrate 1 is, for example, $1.0\times10^{18}$ cm$^{-3}$ or more and $1.0\times10^{20}$ cm$^{-3}$ or less.

The substrate 1 has, for example, a main surface is which is an epitaxial growth surface. In the present embodiment, a lowest index crystal plane closest to the main surface 1s is, for example, the c-plane.

The main surface is of the substrate 1 is mirror-finished, for example, and a root mean square roughness RMS of the main surface 1s of the substrate 1 is, for example, less than 1 nm.

Further, in the present embodiment, the impurity concentration in the substrate 1 obtained by the above-described manufacturing method is lower than that of the substrate obtained by a flux method, an ammonothermal method, or the like.

Specifically, a hydrogen concentration in the substrate 1 is, for example, less than $1\times10^{17}$ cm$^{-3}$, preferably $5\times10^{16}$ cm$^{-3}$ or less.

Further, in the present embodiment, the substrate 1 is formed by slicing the main growth layer 44 grown with the c-plane 40c as a growth surface, and therefore does not include the inclined interface growth region 70 grown with the inclined interface 30i or the inclined interface 40i as a growth surface. That is, the entire body of the substrate 1 is configured by a low oxygen concentration region.

Specifically, an oxygen concentration in the substrate 1 is, for example, $5\times10^{16}$ cm$^{-3}$ or less, preferably $3\times10^{16}$ cm$^{-3}$ or less.

Further, in the present embodiment, the substrate 1 does not include, for example, the polarity reversal zone (inversion domain) as described above.

(Dark Spot)

Next, a dark spot on the main surface 1s of the substrate 1 of the present embodiment will be described. The "dark spot" referred to herein means a point where an emission intensity is low in an observation image of the main surface 50s observed with a multiphoton excitation microscope, or a cathode luminescence image of the main surface 50s, and includes not only dislocations but also non-emissive centers due to foreign matters or point defects. The "multiphoton excitation microscope" is sometimes referred to as amultiphoton excitation fluorescence microscope.

In the present embodiment, since the substrate 1 is manufactured using the base substrate 10 comprising a high-purity GaN single crystal prepared by the VAS method, there are few non-emission centers in the substrate 1 due to foreign matters or point defects. Accordingly, when the main surface of the substrate 1 is observed with a multiphoton excitation microscope or the like, 95% or more, preferably 99% or more of the dark spots are dislocations rather than non-emission centers due to foreign matters or point defects.

Further, in the present embodiment, by the above-described manufacturing method, the dislocation density in the surface of the second layer 40 is lower than the dislocation density in the main surface 10s of the base substrate 10. Thereby, the dislocations are also lowered in the main surface is of the substrate 1 formed by slicing the second layer 40.

As a result, in the present embodiment, observation of the main surface is of the substrate 1 with a photon excitation microscope in a field of view of 250 μm square to obtain the dislocation density from a dark spot density, reveals that there is no region where the dislocation density exceeds $3\times10^6$ cm$^{-2}$, and a region having a dislocation density of less than $1\times10^6$ cm$^{-2}$ exists in 69% or more, preferably 80% or more of the main surface 1s.

Figure 8:
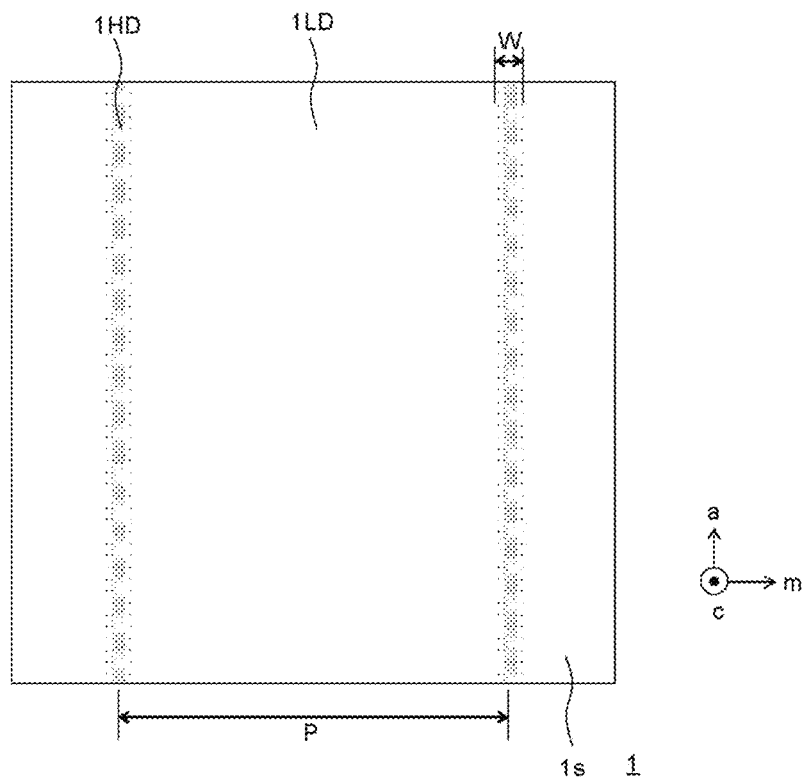
FIG. 8 is a schematic view illustrating an observation image obtained by observing the main surface of the nitride semiconductor substrate according to an embodiment of the present invention with a multiphoton excitation microscope.

Here, a distribution of dislocations as dark spots on the main surface 1s of the substrate 1 will be described in detail, with reference to FIG. 8. FIG. 8 is a schematic view illustrating an observation image obtained by observing the main surface of the nitride semiconductor substrate according to the present embodiment with a multiphoton excitation microscope. Further, a square frame in FIG. 8 shows a predetermined field of view when the substrate is observed with a multiphoton excitation microscope.

As illustrated in FIG. 8, in the present embodiment, the substrate 1 has a high dislocation density region 1HD and a low dislocation density region 1LD in the main surface 1s due to the fact that dislocations are collected at the upper side of the mask layer 20 used in the above-described manufacturing method. The dislocation density of the low dislocation density region 1LD is lower than the dislocation density of the high dislocation density region 1HD.

Specifically, in the main surface is of the substrate 1 of the present embodiment, the dislocation density of the low dislocation density region 1LD is, for example, less than $1\times10^6$ cm$^{-2}$, preferably $7\times10^5$ cm$^{-2}$ or less, more preferably less than $5.5\times10^5$ cm$^{-2}$, and even more preferably $3\times10^5$ cm$^{-2}$ or less.

On the other hand, the dislocation density of the high dislocation density region 1HD is also slightly lower than that of the base substrate 10, and for example, it is $3\times10^6$ cm$^{-2}$ or less, preferably $2\times10^6$ cm$^{-2}$ or less, and more preferably $1\times10^6$ cm$^{-2}$ or less. The dislocation density of the high dislocation density region 1HD is larger than a maximum value of the dislocation density of the low dislocation density region 1LD.

A position of the high dislocation density region 1HD in a plan view corresponds to (overlaps) a position of the mask layer 20 used in the above-described manufacturing method. Each of the high dislocation density region 1HD and the low dislocation density region 1LD has a striped shape extending along one of the directions along the m-axis and the a-axis, for example. The high dislocation density region 1HD and the low dislocation density region 1LD are provided alternately, for example, in the other direction of either the direction along the m-axis or the direction along the a-axis.

In the present embodiment, for example, each of the high dislocation density region 1HD and the low dislocation density region 1LD has a striped shape extending in the direction along the a-axis, for example. The high dislocation density region 1HD and the low dislocation density region 1LD are alternately provided in the direction along the m-axis perpendicular to the a-axis.

Further, the pitch P in a lateral direction (direction perpendicular to the stripe) of the high dislocation density region 1HD corresponds to the pitch p of the mask layer 20 described above, and is, for example, 800 μm or more. The pitch P of the high dislocation density region 1HD means a distance between the centers of the high dislocation density regions 1HD, or the pitch P of the high dislocation density region 1HD may be considered as a distance from a maximum position of the dislocation density in each 250 μm square of the field of view to an adjacent maximum position.

Further, according to the results of examples described later, width W of the high dislocation density region 1HD in a short direction is, for example, 100 μm or more and 250 μm or less.

Accordingly, the proportion of the high dislocation density region 1HD in the main surface is of the substrate 1 is obtained by W/P×100, and is, for example, 31% or less.

This means that the low dislocation density region 1LD in which the dislocation density in the main surface is of the substrate 1 is less than $1\times10^6$ cm$^{-2}$, exists in 69% or more, preferably 80% or more of the main surface is of the substrate 1.

Further, at least a part of the low dislocation density region 1LD includes a dislocation-free region of at least 50 μm square (50 μm square or more), for example, based on the average distance L between the closest tops in the first step S200 described above. Preferably, the 50 μm square dislocation-free region is scattered over, for example, a plurality of low dislocation density regions 1LD.

Further, the density of the non-overlapping 50 μm square dislocation-free regions in the entire main surface is of the substrate 1 of the present embodiment is, for example, 100/cm$^2$ or more, preferably 600/cm$^2$ or more, more preferably 1200/cm$^2$ or more. When the dislocation-free region in only the low dislocation density region 1LD is measured, the density of the non-overlapping 50 μm square dislocation-free regions in the plurality of low dislocation density regions 1LD is, for example, 130/cm$^2$ or more, preferably 800/cm$^2$ or more, and more preferably 1600/cm$^2$ or more.

An upper limit value of the density of the non-overlapping 50 μm square dislocation-free regions is, for example, 30,000/cm$^2$ because the ratio of the visual field including the high dislocation density region is at least 1/4.

For a reference, in a substrate obtained by a conventional manufacturing method that does not perform a special process of collecting dislocations, the size of the dislocation-free region is smaller than 50 μm square, or the density of the 50 μm square dislocation-free region is lower than 100/cm$^2$. Further, even in the substrate obtained by the conventional ELO method in which the c-plane remains, the size of the dislocation-free region is smaller than 50 μm square, or the density of the 50 μm square dislocation-free region is lower than 100/cm$^2$.

Next, Burgers vector of the dislocations in the substrate 1 of the present embodiment will be described.

In the present embodiment, since the dislocation density in the main surface 10s of the base substrate 10 used in the above-described manufacturing method is low, a plurality of dislocations are less likely to be combined (mixed) when the first layer 30 and the second layer 40 are grown on the base substrate 10. This makes it possible to suppress the formation of dislocations having a large Burgers vector in the substrate 1 obtained from the second layer 40.

Specifically, in the substrate 1 of the present embodiment, for example, there are many dislocations whose Burgers vector is either <11-20>/3, <0001>, or <11-23>/3. The "Burgers vector" herein can be measured by, for example, a large-angle convergent-beam electron diffraction method (LACBED method) with a transmission electron microscope (TEM). Further, dislocations whose Burgers vector is <11-20>/3 are edge dislocations, and dislocations whose Burgers vector is <0001> are screw dislocations, and dislocations whose Burgers vector is <11-23>/3 are mixed dislocations in which edge dislocations and screw dislocations are mixed.

In the present embodiment, random extraction of 100 dislocations on the main surface 50s of the substrate 1 reveals that a percentage of dislocations whose Burgers vector is either <11-20>/3, <0001> or <11-23>/3, is, for example, 50% or more, preferably 70% or more, and more preferably 90% or more. Dislocations whose Burgers vector is 2<11-20>/3 or <11-20> may be present in at least a part of the main surface 50s of the substrate 1.

(4) Effect Obtained by the Present Embodiment

According to the present embodiment, one or more of the following effects can be obtained.

(a) In the first step S200, since the inclined interface 30i other than the c-plane is generated on the surface of the single crystal constituting the first layer 30, the dislocations can be bent and propagated in a direction substantially perpendicular to the inclined interface 30i, at a position where the inclined interface 30i is exposed. Thereby, the dislocations can be collected locally. Since the dislocations are collected locally, the dislocations having Burgers vectors that are opposite to each other can disappear. Alternatively, since the locally collected dislocations form a loop, the dislocations can be prevented from propagating to the surface side of the second layer 40. In this way, the dislocation density in the surface of the second layer 40 can be lowered. As a result, it is possible to obtain the substrate 1 having a dislocation density lower than that of the base substrate 10.

(b) In the first step S200, the c-plane 30c disappears from the top surface 30u of the first layer 30. Thereby, the dislocations propagating from the base substrate 10 can be reliably bent at the position where the inclined interface 30i in the first layer 30 is exposed.

Here, a case where the c-plane remains in the first step will be considered. In this case, in the portion where the c-plane remains, the dislocations propagated from the base substrate propagate substantially vertically upward without being bent and reach the surface of the second layer. Therefore, in the upper part of the portion where the c-plane remains, dislocations are not lowered and a high dislocation density region is formed.

In contrast, according to the present embodiment, since the c-plane 30c disappears from the top surface 30u of the first layer 30 in the first step S200, the surface of the first layer 30 can be formed only by the inclined interface 30i other than the c-plane. Thereby, the dislocations propagating from the base substrate 10 can be reliably bent over the entire surface of the first layer 30. Since the dislocations are reliably bent, some of the plurality of dislocations can be easily disappears, or some of the plurality of dislocations is hardly propagated to the surface side of the second layer 40. As a result, the dislocation density can be lowered over the entire main surface is of the substrate 1 obtained from the second layer 40.

(c) In the first step S200, since a plurality of concaves 30p composed of inclined interfaces 30i other than the c-plane, are formed on the top surface 30u of the first layer 30, the c-plane 30c can easily and surely disappear. Here, when the pitch of the mask layer 20 is long, there is a case where a substantially triangular columnar three-dimensional growth layer having only one top is formed at the upper side of the openings of the mask without forming concaves on the top surface of the first layer. Then, as described above, it becomes difficult to make the c-plane disappear during the growth process, and there is a possibility that the c-plane remains at least in part. In contrast, in the present embodiment, since a plurality of concaves 30p are formed on the top surface 30u of the first layer 30, the proportion of the inclined interfaces 30i in the surface of the first layer 30 is increased and the c-plane 30c can be contracted quickly. As a result, even when the pitch of the mask layer 20 is long, the c-plane 30c can easily and surely disappear at the upper side of the openings 20a of the mask layer 20.

(d) Since a plurality of concaves 30p composed of inclined interfaces 30i other than the c-plane are formed on the top surface 30u of the first layer 30 to make the c-plane 30c disappear in the first step S200, a plurality of valleys 30v and a plurality of tops 30t can be formed at the upper side of the openings 20a of the mask layer 20. In other words, at least one valley 30v and a plurality of tops 30t can be formed at the upper side of each of the plurality of openings 20a of the mask layer 20.

In the present embodiment, since a plurality of valleys 30v and a plurality of tops 30t are formed at the upper side of the openings 20a of the mask layer 20, the height from the main surface 10s to the top 30t of the base substrate 10 can be made lower than in the case of forming a large substantially triangular columnar three-dimensional growth layer at the upper side of the openings of the mask. Thereby, the surface of the second layer 40 can be quickly mirror-finished. Since the surface of the second layer 40 is quickly mirror-finished, a layer up to the main growth layer 44 can be thinned, that is, a useless layer from which the substrate 1 cannot be obtained can be thinned. As a result, an increase in the manufacturing cost of the substrate 1 can be suppressed.

Further, in the present embodiment, since a plurality of valleys 30v and a plurality of tops 30t are randomly formed at the upper side of the openings 20a of the mask layer 20, dislocations can be randomly dispersed, the dislocations being bent at positions where the inclined interface 30i other than the c-plane is exposed. Thereby, a local concentration of the dislocations can be suppressed compared with a case where the mask layer is formed at a narrow pitch. Since the local concentration of the dislocations is suppressed, the inclusion of the high dislocation density region in the semiconductor device can be suppressed when the semiconductor device is cut out from the substrate 1. As a result, the yield of the semiconductor device can be improved.

(e) As described above, since a plurality of inclined interfaces 30i other than the c-plane are formed at the upper side of the openings 20a of the mask layer 20, and dislocations are bent at each of the plurality of inclined interfaces 30i, the dislocation density can be lowered sharply and faster than in the case of c-plane limited growth. That is, a reduction rate of the dislocation density obtained by N/No in the present embodiment can be made smaller than a reduction rate of the dislocation density obtained by N'/N$_0$ in the case of the c-plane limited growth. As a result, the substrate 1 having a lower dislocation density than the base substrate 10 can be efficiently obtained, and its productivity can be improved.

In the present embodiment, since the observation of an arbitrary cross section perpendicular to the main surface 10s of the base substrate 10, reveals that the average distance L between the closest tops is more than 100 μm, at least over 50 μm distance can be secured for bending and propagating the dislocations. Thereby, the dislocations can be sufficiently collected in the upper part of the substantially center between the pair of tops 30t of the first layer 30. As a result, the dislocation density in the surface of the second layer 40 can be sufficiently lowered.

(g) In the first step S200, after the c-plane 30c disappears from the surface of the first layer 30, the growth of the first layer 30 is continued over a predetermined thickness, while maintaining the state where the surface is composed only of the inclined interface 30i. Thereby, the c-plane 30c can reliably disappears over the entire surface of the first layer 30. For example, even if the timing is off at which the c-plane 30c disappears on the surface of the first layer 30 in the inclined interface expansion step S220 and the c-plane 30c remains on a part of the expanded inclined interface layer 32, the c-plane 30c can reliably disappear.

Further, due to continuing of the growth of the first layer 30 at the inclined interface 30i after the c-plane 30c disappears, a sufficient time can be secured to bend the dislocations at the position where the inclined interface 30i is exposed. Here, when the c-plane grows immediately after the c-plane disappears, there is a possibility that the dislocations are not sufficiently bent and propagate in the substantially vertical direction toward the surface of the second layer. In contrast, according to the present embodiment, since sufficient time is secured to bend the dislocations at the position where the inclined interface 30i other than the c-plane is exposed, particularly, the dislocations near the top 30t of the first layer 30 can be reliably bent, and the propagation of dislocations in the substantially vertical direction from the base substrate 10 toward the surface of the second layer 40, can be suppressed. Thereby, the concentration of the dislocations in the upper part of the top 30t of the first layer 30 can be suppressed.

OTHER EMBODIMENTS

As described above, the embodiments of the present disclosure have been specifically described. However, the present disclosure is not limited to the above-described embodiments, and various modifications can be made without departing from the gist thereof.

In the above-described embodiment, explanation is given for the case where the base substrate 10 is a GaN free-standing substrate. However, the base substrate 10 is not limited to the GaN free-standing substrate, and for example, may be a free-standing substrate comprising a group III nitride semiconductor such as aluminum Nitride (AlN), indium gallium nitride (AlGaN), indium nitride (InN), indium gallium nitride (InGaN), indium gallium nitride (AlInGaN), that is, a free-standing substrate comprising a group III nitride semiconductor represented by a composition formula of

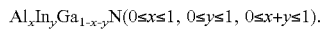

In the above-described embodiment, explanation is given for the case where the substrate 1 is a GaN free-standing substrate. However, the substrate 1 is not limited to the GaN free-standing substrate, and for example, may be a free-standing substrate comprising a group III nitride semiconductor such as AlN, AlGaN, InN, InGaN, AlInGaN, that is, a group III nitride semiconductor represented by a composition formula of $Al_xIn_yGa_{1-x-y}N$ ($0 \leq x \leq 1$, $0 \leq y \leq 1$, $0 \leq x+y \leq 1$).

In the above-described embodiment, explanation is given for the case where the substrate 1 is n-type. However, the substrate 1 may be p-type or may have semi-insulating properties. For example, when manufacturing a semiconductor device as a high electron mobility transistor (HEMT) using the substrate 1, the substrate 1 preferably has semi-insulating properties.

In the above-described embodiment, explanation is given for the case where the base substrate 10 is manufactured by the VAS method in the base substrate preparation step S100. However, a method other than the VAS method may be used as long as it is a method for preparing the base substrate 10.

In the above-described embodiment, explanation is given for the case where the opening 20a of the mask layer 20 has a striped shape extending along the a-axis in the mask layer forming step S180. However, the opening 20a of the mask layer 20 may have a striped shape extending along the direction along the m-axis.

In the above-described embodiment, explanation is given for the case where the growth temperature is mainly adjusted as the first growth condition in the first step S200. However, when the first growth condition satisfies the formula (1), the growth condition other than the growth temperature may be adjusted, or the growth temperature and the growth condition other than the growth temperature may be adjusted in combination, as a first growth condition.

In the above-described embodiment, explanation is given for the case where the growth temperature is mainly adjusted as the second growth condition in the second step S300. However, when the second growth condition satisfies the formula (2), the growth condition other than the growth temperature may be adjusted, or the growth temperature and the growth condition other than the growth temperature may be adjusted in combination, as a second growth condition.

In the above-described embodiment, explanation is given for the case where the growth condition in the inclined interface maintenance step S240 is maintained under the above-described first growth condition as in the inclined interface expansion step S220. However, when the growth condition in the inclined interface maintenance step S240 satisfy the first growth condition, the growth condition in the inclined interface maintenance step S240 may be different from the growth condition in the inclined interface expansion step S220.

In the above-described embodiment, explanation is given for the case where the growth condition in the main growth step S340 is maintained under the above-described second growth condition as in the c-plane expansion step S320. However, when the growth condition in the main growth step S340 satisfies the second growth condition, the growth condition in the main growth step S340 may be different from the growth condition in the c-plane expansion step S320.

In the above-described embodiment, explanation is given for the case where the main growth layer 44 is sliced using a wire saw in the slicing step S400. However, for example, an outer peripheral blade slicer, an inner peripheral blade slicer, an electric discharge machine, or the like may be used.

In the above-described embodiment, explanation is given for the case where the substrate 1 is obtained by slicing the main growth layer 44 in the laminated structure 2. However, the present disclosure is not limited thereto. For example, the laminated structure 2 may be used as it is to manufacture a semiconductor laminate for manufacturing a semiconductor device. Specifically, after preparing the laminated structure 2, in the semiconductor laminate manufacturing step, a semiconductor functional layer is epitaxially grown on the laminated structure 2 to prepare a semiconductor laminate. After preparing the semiconductor laminate, a back surface side of the laminated structure 2 is polished, and the base substrate 10, the first layer 30, and the c-plane expanded layer 42 are removed from the laminated structure 2. Thereby, a semiconductor laminate having the main growth layer 44 and the semiconductor functional layer can be obtained as in the above-described embodiment. According to this case, the slicing step S400 and the polishing step S500 for obtaining the substrate 1 can be omitted.

In the above-described embodiment, explanation is given for the case where the manufacturing step is completed after the substrate 1 is manufactured. However, the substrate 1 may be used as the base substrate 10, and steps S200 to S500 may be repeated. Thereby, the substrate 1 having a further lowered dislocation density can be obtained. Further, the steps S200 to S500 using the substrate 1 as the base substrate 10 may be set as one cycle, and the cycle may be repeated a plurality of times. Thereby, the dislocation density of the substrate 1 can be gradually lowered according to the number of times the cycle is repeated.

In the above-described embodiment, explanation is given for the case where the substrate 1 has the high dislocation density region 1HD and the low dislocation density region 1LD. However, when the second layer 40 is grown thick, the substrate 1 sliced from the second layer 40 is not required to show a clear difference between the high dislocation density region 1HD and the low dislocation density region 1LD, because the dislocations are scattered during the growth process of the second layer 40.

Example

Hereinafter, various experimental results supporting the effects of the present disclosure will be described.

(1) Preparation of a Laminated Structure for Producing a Nitride Semiconductor Substrate A laminated structure for preparing the nitride semiconductor substrate of samples 1 to 4 was produced under the following conditions and configurations, using the method of the above-described embodiment.

[Sample 1]
(Base Substrate)
Material: GaN
Manufacturing method: VAS method
Diameter: 2 inches
Thickness: 400 μm
Crystal plane with the lowest index closest to the main plane: c plane
Off-angle of main surface: 0.4° in m direction
Dislocation density in the main surface of the base substrate was $3.0 \times 10^6$ cm$^{-2}$.
(Mask Layer)
Planar view shape of mask layer: Striped shape
Extending direction of mask layer: a-axis direction
Mask layer thickness: 1 μm
Mask layer width: 10 μm
Mask layer pitch: 1 mm
(First Layer)
Material: GaN
Growth method: HVPE method
The first growth condition will be described later.
(Second Layer)
Material: GaN
Growth method: HVPE method
Growth temperature: 1050° C.
V/III ratio: 2
The above second growth condition satisfies formula (2).
[Sample 2]
(Base Substrate)
Same as sample 1.
(Mask Layer)
Same as sample 1.
(First Layer)
Material: GaN
Growth method: HVPE method
The first growth condition is different from sample 1. The first growth condition will be described later.
(Second Layer)
Same as sample 1.
[Sample 3]
(Base Substrate)
Same as sample 1.
(Mask Layer)
Same as sample 1.
(First Layer)
Material: GaN
Growth method: HVPE method
The first growth condition is different from samples 1 and 2. The first growth condition will be described later.
(Second Layer)
Same as sample 1.
[Sample 4]
(Base Substrate)
Same as sample 1.
(Mask Layer)
Same as sample 1.
(First Layer)
Material: GaN
Growth method: HVPE method
The first growth condition is different from samples 1 to 3. The first growth condition will be described later.
(Second Layer)
Same as sample 1.
(First Growth Condition)

The first growth condition for growing the first layer in the above samples 1 to 4 is set so that $Gc_1/G_i$ increases in an order of sample 1<sample 2<sample 3<sample 4 by adjusting at least one of the growth temperature, V/III ratio, etc., $Gc_1/G_i$ being the ratio of a growth rate $Gc_1$ of the c-plane of the first layer to a growth rate $G_i$ of the inclined interface most inclined with respect to the c-plane of the first layer (hereinafter, also referred to as "c-plane growth rate ratio $Gc_1/G_i$"). Specifically, in sample 1, the growth temperature in the first step was 1030° C., and the V/III ratio was 10 so that the first growth condition did not satisfy formula (1). In sample 2, although the first growth condition satisfies formula (1), the growth temperature in the first step was 1023° C., and the V/III ratio was 10. In contrast, in samples 3 and 4, the growth temperature was 980° C. or higher and 1,020° C. or lower, and the V/III ratio was 1 or higher and 15 or lower. At this time, in samples 3 and 4, at least one of the growth temperature and the V/III ratio was adjusted within the above range so that the first growth condition satisfied formula (1).

Further, in samples 3 and 4, growth was continued for a predetermined time while maintaining the c-plane growth rate ratio $Gc_1/G_i$, after the timing when the c-plane disappears from the top surface of the first layer. The growth time of the first step in samples 3 and 4 was the same as each other.

(2) Evaluation
(Observation with a Fluorescence Microscope)
The cross section of the above-described laminated structure was observed with a fluorescence microscope.
(Observation with a Multi-Photon Excitation Microscope)
The surface (top surface) of the second layer of the above-described laminated structure was observed with a multi-photon excitation microscope. At this time, a dark spot density (that is, dislocation density) in the surface of the laminated structure was measured every 250 μm of the field of view. It is confirmed by measuring by shifting a focus in a thickness direction that all dark spots on these substrates are dislocations. Further, at this time, the ratio of the number of regions having a dislocation density of less than $1 \times 10^6$ $cm^{-2}$ (low dislocation density region) with respect to the total number of measurement regions in a 250 μm square field of view was obtained.

(3) Result
The results of samples 1 to 4 will be described with reference to FIGS. 9 to 17. FIG. 9, FIG. 11, FIG. 12, FIG. 14, and FIG. 16 are views illustrating observation images obtained by observing the cross sections of the laminated structures of samples 1 to 4 with a fluorescence microscope, respectively. In FIGS. 9, 11, 12, 14, and 16, the arrows in the base substrate indicate the position of the mask layer. FIG. 10, FIG. 13, FIG. 15, and FIG. 17 are views illustrating observation images obtained by observing the surfaces of the laminated structures of samples 1 to 4 with a multiphoton excitation microscope, respectively. In FIGS. 15 and 17, a thick line frame shows a 50 μm square dislocation-free region.

Figure 9:
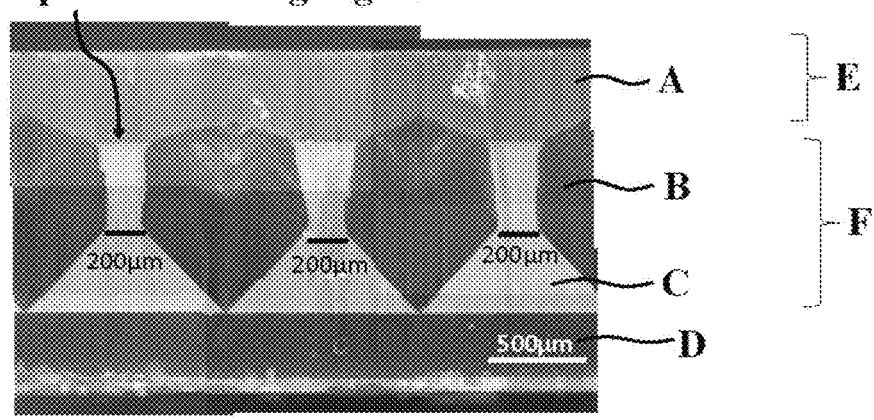
FIG. 9 is a view illustrating an observation image obtained by observing a cross section of a laminated structure of sample 1 with a fluorescence microscope.

(Sample 1)
As illustrated in FIG. 9, in sample 1, the top of the first layer was not formed at the upper side of the openings of the mask layer, and an upper part of the first c-plane growth region of the first layer and a lower part of the second c-plane growth region of the second layer were connected. It can be considered that the c-plane remains in the growth process of the first layer. The width of the c-plane remaining region was about 200

Figure 10:
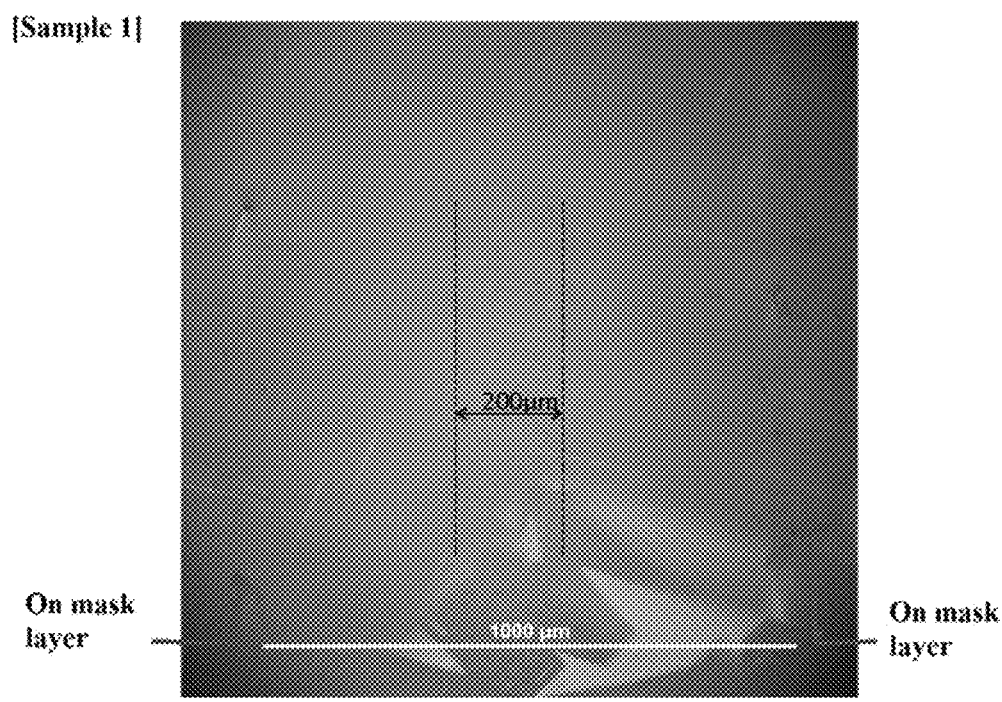
FIG. 10 is a view illustrating an observation image obtained by observing the surface of the laminated structure of sample 1 with a multiphoton excitation microscope.

Further, as illustrated in FIG. 10, in sample 1, high dislocation density regions overlapping the mask layer were formed at a pitch of 1 mm. Further, each high dislocation density region overlapping the c-plane remaining region was formed with a width of about 200 The dislocation density of the high dislocation density region was $1.2 \times 10^6$ to $3.0 \times 10^6$ $cm^{-2}$. On the other hand, the low dislocation density region was formed between the high dislocation density regions, and the ratio of the low dislocation density region to the surface of the laminated structure was less than 50%. The dislocation density of the low dislocation density region was $2.7 \times 10^5$ to $9.0 \times 10^5$ $cm^{-2}$. Further, no dislocation-free region of 50 μm square was formed in the low dislocation density region of sample 1.

In sample 1, the c-plane growth rate ratio $Gc_1/G_i$ is lower than that of the other samples under the first growth condition for growing the first layer, and the first growth condition did not satisfy formula (1). Therefore, the c-plane could not disappear during the growth process of the first layer. Since the c-plane did not disappear, the dislocations propagated to the surface side of the second layer without bending in the above-described c-plane remaining region. Therefore, the high dislocation density region was formed at a position overlapping the c-plane remaining region. As a result, it can be considered that the ratio of the low dislocation density region to the surface of the laminated structure became low.

Figure 11:
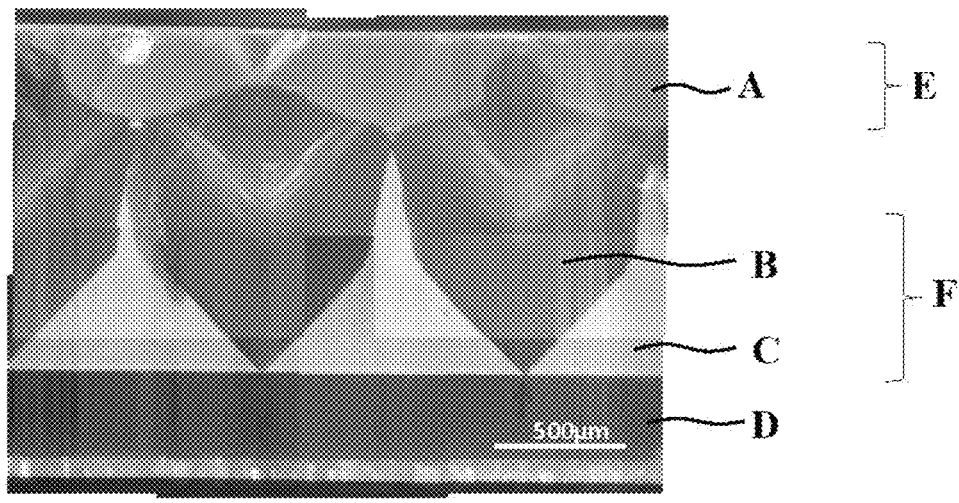
FIG. 11 is a view illustrating an observation image obtained by observing a cross section of a laminated structure of sample 2 with a fluorescence microscope.

(Sample 2)
As illustrated in FIG. 11, in sample 2, the c-plane disappeared in the first layer, and a substantially triangular columnar first layer having only one top was formed at the upper side of the openings of the mask layer. The average distance between the closest tops was approximately 1 mm. Further, the height from the main surface of the base substrate to the top of the first c-plane growth region was 890 μm, and the thickness of the boundary surface of the second layer at the position where the inclined interface disappeared, from the main surface of the base substrate (thickness until the second layer became a mirror surface) was approximately 1250 μm.

Figure 12:
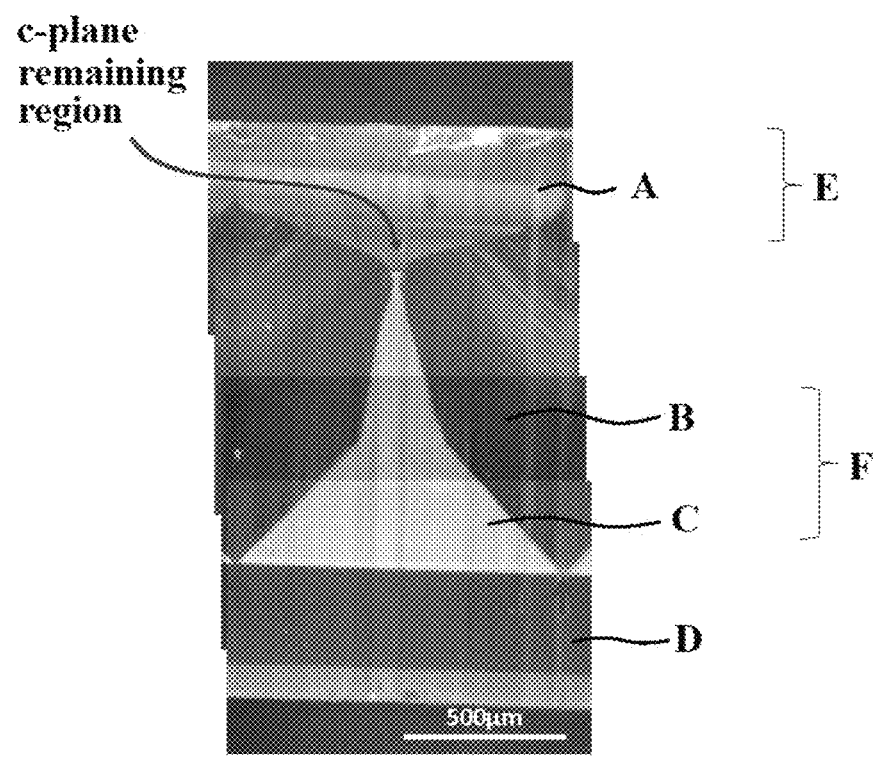
FIG. 12 is a view illustrating an observation image obtained by observing a cross section of the laminated structure of sample 2 with a fluorescence microscope.

As illustrated in FIG. 12, a portion where the c-plane of the first layer remained (c-plane remaining region) was scattered in a part of the laminated structure. The width of the c-plane remaining region was about 20 μm.

Figure 13:
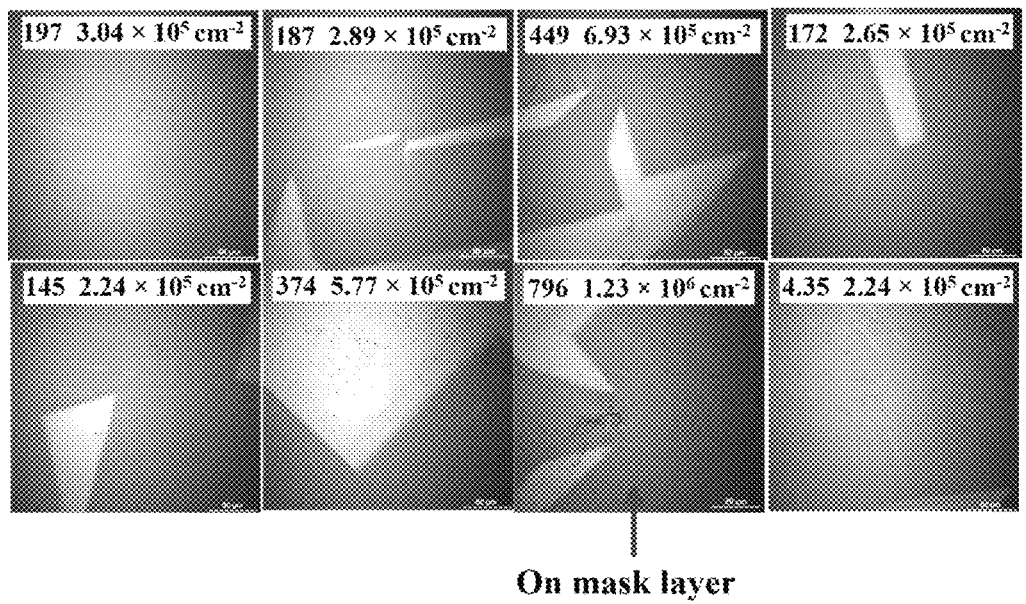
FIG. 13 is a view illustrating an observation image obtained by observing the surface of the laminated structure of sample 2 with a multiphoton excitation microscope.

Further, as illustrated in FIG. 13, in sample 2, the high dislocation density regions overlapping the mask layer were formed at a pitch of 1 mm. The dislocation density of the high dislocation density region was $7.0 \times 10^5$ to $3.0 \times 10^6$ $cm^{-2}$. On the other hand, the low dislocation density region was formed between the high dislocation density regions which are formed at a pitch of 1 mm. Wherein, minute high dislocation density regions were scattered between the high dislocation density regions which are formed at a pitch of 1 mm. The ratio of the low dislocation density region to the surface of the laminated structure was 60%. The dislocation density of the low dislocation density region was $2.2 \times 10^5$ to $7.0 \times 10^5$ $cm^{-2}$. Further, almost no dislocation-free region of 50 μm square was formed in the low dislocation density region of sample 2. The density of the 50 μm square dislocation-free region in the entire surface of sample 2 was lower than 100/$cm^2$. Further, the reduction rate of the dislocation density obtained by N/No was, for example, 0.23 or less.

In sample 2, since the c-plane growth rate ratio $Gc_1/G_i$ was higher than that of sample 1 under the first growth condition for growing the first layer, and the first growth condition satisfies formula (1), the c-plane could disappear during the growth process of the first layer. Thereby, the dislocations could be bent at the position where the inclined interface in the first layer was exposed. As a result, the low dislocation density region could be formed over a range that almost overlapping the openings of the mask layer.

However, in sample 2, since the c-plane growth rate ratio $Gc_1/G_i$ under the first growth condition was not sufficiently high, a plurality of tops could not be formed at the upper side of the openings of the mask layer. Further, in the growth process of the first layer, it took time for the c-plane of the first layer to disappear. Therefore, it can be considered that the height from the main surface of the base substrate to the top of the first layer was high, and the thickness until the second layer was mirror-finished was thick. Further, there were scattered parts in which the c-plane of the first layer remained, in a part of the laminated structure, and a disappearance state of the c-plane was unstable. Therefore, it can be considered that minute high dislocation density regions were scattered between the high dislocation density regions which are formed at a pitch of 1 mm. As a result, it can be considered that the ratio of the low dislocation density region to the surface of the laminated structure became low.

Figure 14:
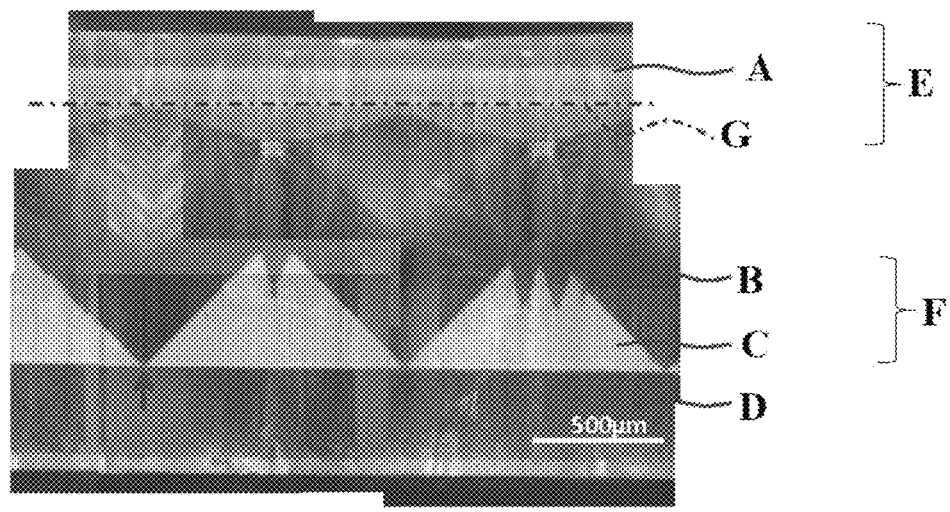
FIG. 14 is a view illustrating an observation image obtained by observing a cross section of the laminated structure of sample 3 with a fluorescence microscope.
Figure 15:
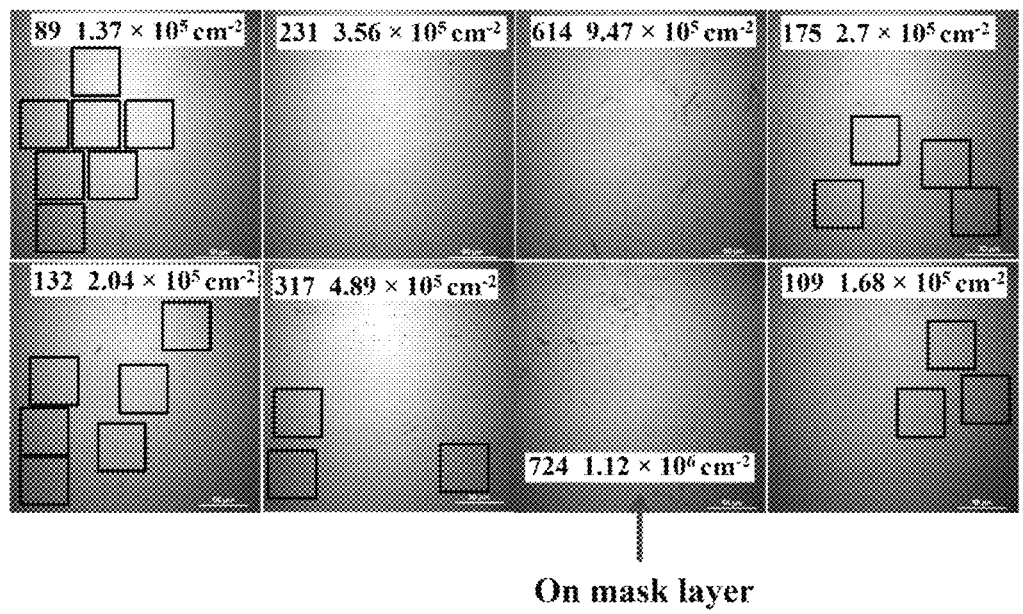
FIG. 15 is a view illustrating an observation image obtained by observing the surface of the laminated structure of sample 3 with a multiphoton excitation microscope.

(Sample 3)
As illustrated in FIG. 14, in sample 3, the c-plane disappeared in the first layer, and at least one valley and a plurality of tops were formed at the upper side of one opening of the mask layer. An average value of the angles formed by the pair of inclined portions in the first c-plane growth region was approximately 57.1°. Further, the average distance between the closest tops was approximately 400 µm. The average distance between the closest tops at the upper side of the openings of the mask layer was approximately 125 µm. Further, the height from the main surface of the base substrate to the top of the first c-plane growth region was approximately 410 µm. Further, the inclined interface growth region was continuously formed along the main surface of the base substrate. Further, the thickness of the boundary surface of the second layer at the position where the inclined interface disappeared, was approximately 980 µm from the main surface of the base substrate.

Further, as illustrated in FIG. 15, in sample 3, the high dislocation density regions overlapping the mask layer were formed at a pitch of 1 mm. The width of the high dislocation density region was approximately 100 to 250 µm. The dislocation density of the high dislocation density region was $9.5 \times 10^5$ to $2.0 \times 10^6$ cm$^{-2}$. On the other hand, the low dislocation density region was formed between the high dislocation density regions which are formed at a pitch of 1 mm. The ratio of the low dislocation density region to the surface of the laminated structure was 69% or more. The dislocation density of the low dislocation density region was $1.3 \times 10^5$ to $5.0 \times 10^5$ cm$^{-2}$. Further, in the low dislocation density region of sample 3, a plurality of dislocation-free regions having a size of 50 µm square or more were formed. The 50 µm square dislocation-free regions were scattered over a plurality of low dislocation density regions. Further, the density of non-overlapping 50 µm square dislocation-free regions in the entire surface of the laminated structure was approximately 4500/cm$^2$. Further, the reduction rate of the dislocation density obtained by $N/N_0$ was, for example, 0.17 or less.

In sample 3, the c-plane growth rate ratio $Gc_1/G_i$ was higher than that of samples 1 and 2 under the first growth condition for growing the first layer, and the first growth condition satisfied formula (1). Thereby, in the growth process of the first layer, a plurality of concaves were formed on the top surface of the first layer, and the c-plane could easily and surely disappear. Since the c-plane surely disappeared, the dislocations could be reliably bent at the position where the inclined interface in the first layer was exposed. As a result, it was confirmed that the low dislocation density regions could be formed over the entire area overlapping the openings of the mask layer, and the ratio of the low dislocation density region to the surface of the laminated structure could be 69% or more.

Further, in sample 3, since the c-plane growth rate ratio $Gc_1/G_i$ under the first growth condition is higher than that of sample 2, at least one valley and a plurality of tops could be formed at the upper side of the openings of the mask layer. Thereby, it was confirmed that the thickness of the second layer until it became a mirror surface could be decreased.

Further, in sample 3, since the c-plane growth rate ratio $Gc_1/G_i$ under the first growth condition was appropriately adjusted, the average distance between the closest tops could be more than 100 Thereby, it was confirmed that the dislocation density of the low dislocation density region could be sufficiently lowered. Since the average distance between the closest tops was more than 100 it was confirmed that a plurality of dislocation-free regions of 50 µm square or more could be formed in the low dislocation density region, and the 50 µm square dislocation-free regions could be scattered over a plurality of low dislocation density regions. Further, it was also confirmed that the density of the non-overlapping 50 µm square dislocation-free regions in the entire surface of the laminated structure could be 1600/cm$^2$ or more.

(Sample 4)

Figure 16:
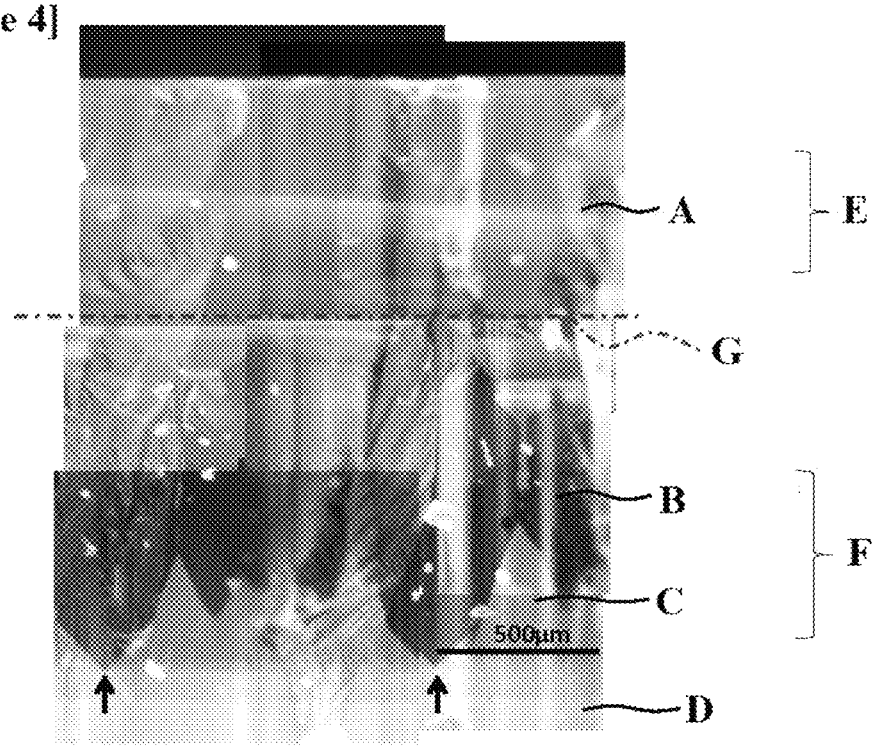
FIG. 16 is a view illustrating an observation image obtained by observing the cross section of the laminated structure of sample 4 with a fluorescence microscope.
Figure 17:
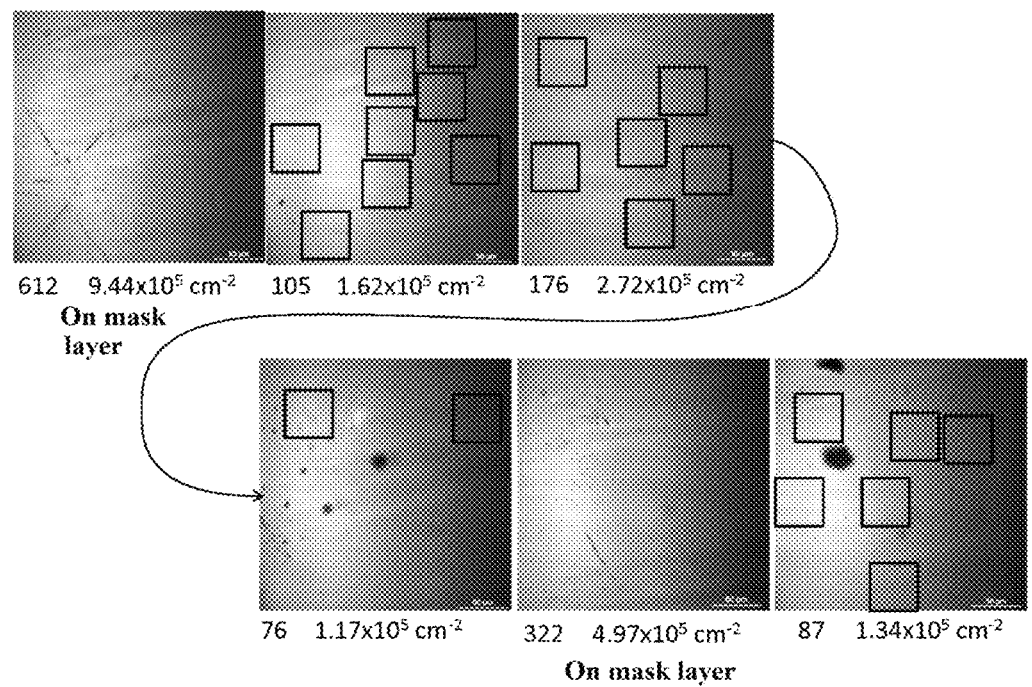
FIG. 17 is a view illustrating an observation image obtained by observing the surface of the laminated structure of sample 4 with a multiphoton excitation microscope.

As illustrated in FIG. 16, in sample 4, the c-plane disappeared in the first layer, and more valleys and tops were formed at the upper side of the openings of the mask layer than in sample 3. The average value of the angles formed by the pair of inclined portions in the first c-plane growth region was 54.4°. Further, the average distance between the closest tops was approximately 260 The average distance between the closest tops at the upper side of the openings of the mask layer was approximately 199 µm. Further, the height from the main surface of the base substrate to the top of the first c-plane growth region was approximately 360 Further, the inclined interface growth region was continuously formed along the main surface of the base substrate. Further, the thickness of the boundary surface of the second layer at the position where the inclined interface disappeared was about 1090 µm from the main surface of the base substrate.

Further, as illustrated in FIG. 17, in sample 4, the high dislocation density regions overlapping the mask layer were formed at a pitch of 1 mm. The width of the high dislocation density region was approximately 100 to 250 The dislocation density of the high dislocation density region was $5.0 \times 10^5$ to $1.0 \times 10^6$ cm$^{-2}$. On the other hand, the low dislocation density region was formed between the high dislocation density regions which are formed at a pitch of 1 mm. The ratio of the low dislocation density region to the surface of the laminated structure was 69% or more. The dislocation density of the low dislocation density region was $1.2 \times 10^5$ to $5.0 \times 10^5$ cm$^{-2}$. Further, in the low dislocation density region of sample 4, a plurality of dislocation-free regions having a size of 50 µm square or more were formed. The 50 µm square dislocation-free regions were scattered over a plurality of low dislocation density regions. Further, the density of the non-overlapping 50 µm square dislocation-free regions in the entire surface of the laminated structure was approximately 5000/cm$^2$. Further, the reduction rate of the dislocation density determined by $N/N_0$ was, for example, 0.17 or less.

In sample 4, since the c-plane growth rate ratio $Gc_1/G_i$ under the first growth condition for growing the first layer is higher than that of sample 3, and the first growth condition satisfied formula (1). Thereby, a plurality of concaves were formed on the top surface of the first layer, and the c-plane could easily and surely disappear in the growth process of the first layer. As a result, in the same way as in sample 3, it was confirmed that the low dislocation density regions could be formed over the entire area overlapping the openings of the mask layer, and the ratio of the low dislocation density region to the surface of the laminated structure could be 69% or more.

In sample 4, since the c-plane growth rate ratio $Gc_1/G_i$ under the first growth condition was higher than that of sample 3, more valleys and tops could be formed at the upper side of the openings of the mask layer than in sample 3. Thereby, it was confirmed that the thickness of the second layer until it became a mirror surface could be decreased. In addition, the growth time of the first step in sample 4 was set to the same time as in sample 3, but it is considered possible to decrease the thickness of the second layer until it became a mirror surface by optimizing the growth time in the first step.

Further, in sample 4, since the c-plane growth rate ratio $Gc_1/G_i$ under the first growth condition was appropriately adjusted, the average distance between the closest tops could be more than 100 Thereby, in the same way as in sample 3, it was confirmed that the dislocation density of the low dislocation density region could be sufficiently lowered.

Since the average distance between the closest tops was more than 100 in the same way as in sample 3, it was confirmed that a plurality of dislocation-free regions of 50 μm square or more could be formed in the low dislocation density region, and the 50 μm square dislocation-free regions could be scattered over a plurality of low dislocation density regions. Further, it was also confirmed that the density of the non-overlapping 50 μm square dislocation-free regions in the entire surface of the laminated structure could be 1600/cm² or more.

Preferable Aspect of the Present Invention

Hereinafter, preferable aspects of the present disclosure will supplementarily be described.
(Supplementary Description 1)
There is provided a method for manufacturing a nitride semiconductor substrate, which is a method for manufacturing a nitride semiconductor substrate with a vapor deposition method, including:
a step of preparing a base substrate comprising a single crystal of a group III nitride semiconductor, and having a main surface whose closest low index plane is a (0001) plane;
a step of forming a mask layer having a plurality of openings on the main surface of the base substrate;
a first step of epitaxially growing a single crystal of a group III nitride semiconductor on the main surface of the base substrate through the openings of the mask layer, the single crystal of the group III nitride semiconductor being sandwiched between a pair of inclined interfaces other than the (0001) plane and having a top surface with the (0001) plane exposed,
then, forming a plurality of concaves composed of inclined interfaces other than the (0001) plane on the top surface, gradually expanding the inclined interfaces toward an upper side of the main surface of the base substrate, making the (0001) plane disappear from the top surface, and growing a first layer whose surface is composed only of the inclined interfaces; and
a second step of epitaxially growing a single crystal of a group III nitride semiconductor on the first layer, making the inclined interfaces disappear, and growing a second layer having a mirror surface,
wherein in the first step, at least one valley and a plurality of tops are formed at an upper side of each of the plurality of openings of the mask layer by forming the plurality of concaves on the top surface of the single crystal and making the (0001) plane disappear, and
observation of an arbitrary cross section perpendicular to the main surface reveals that,
an average distance between a pair of tops separated in a direction along the main surface is more than 100 μm, the pair of tops being closest to each other among the plurality of tops, with one valley sandwiched between them.
(Supplementary Description 2)
There is provided the method for manufacturing a nitride semiconductor substrate according to supplementary description 1,
wherein in the step of forming the mask layer,
the opening of the mask layer is formed in a striped shape, and a
pitch of the mask layer is 800 μm or more.
(Supplementary Description 3)
There is provided the method for manufacturing a nitride semiconductor substrate according to supplementary description 1 or 2,
wherein in the first step,
the average distance between the pair of tops that are closest to each other, is less than 800 μm.
(Supplementary Description 4)
There is provided the method for manufacturing a nitride semiconductor substrate according to any one of the supplementary descriptions 1 to 3,
wherein in the first step,
after the (0001) plane disappears from the surface, the growth of the first layer is continued over a predetermined thickness while maintaining a state where the surface is composed only of the inclined interfaces.
(Supplementary Description 5)
There is provided the method for manufacturing a nitride semiconductor substrate according to any one of the supplementary descriptions 1 to 4,
wherein in the first step, the first layer is grown under a first growth condition satisfying formula (1), and
in the second step, the second layer is grown under a second growth condition satisfying formula (2), $$G_{c1} > G_i / \cos \theta \tag{1}$$

$$G_{c2} < G_i / \cos \theta \tag{2}$$

(wherein, $G_{c1}$ is a growth rate of the (0001) plane of the first layer, $G_{c2}$ is a growth rate of the (0001) plane of the second layer, $G_i$ is a growth rate of the inclined interface most inclined with respect to the (0001) plane in each of the first layer and the second layer, and θ is an angle formed by the (0001) plane and the inclined interface most inclined with respect to the (0001) plane in each of the first layer and the second layer.)
(Supplementary Description 6)
There is provided the method for manufacturing a nitride semiconductor substrate according to any one of the supplementary descriptions 1 to 5,
wherein in the first step, a first c-plane growth region grown with the (0001) plane as a growth surface is formed in the first layer,
a convex portion is formed at a position where the (0001) plane disappears and terminates as an inflection point that is convex upward in the first c-plane growth region, and a pair of inclined portions are formed on both sides of the first c-plane growth region interposing the convex portion, as a locus of an intersection between the (0001) plane and the inclined interface, and
an angle formed by the pair of inclined portions is 70° or less.
(Supplementary Description 7)
There is provided the method for manufacturing a nitride semiconductor substrate according to any one of the supplementary descriptions 1 to 6,
wherein the first step includes:
a step of gradually expanding the inclined interface toward an upper side of the base substrate to form an expanded inclined interface layer; and
a step of forming an inclined interface maintenance layer over a predetermined thickness on the expanded inclined interface layer in which the (0001) plane disappears from the surface, while maintaining a state where the surface is composed only of the inclined interface other than the (0001) plane.
(Supplementary Description 8)
There is provided the method for manufacturing a nitride semiconductor substrate according to any one of the supplementary descriptions 1 to 7, wherein the second step includes:

a step of contracting the inclined interface other than the (0001) plane while expanding the (0001) plane toward an upper side of the first layer, to form a c-plane expanded layer; and a step of forming a main growth layer over a predetermined thickness with the (0001) plane as a growth surface on the c-plane expanded layer whose surface is mirror-finished.

(Supplementary Description 9)

There is provided the method for manufacturing a nitride semiconductor substrate according to any one of the supplementary descriptions 1 to 8, including:

a step of slicing at least one nitride semiconductor substrate from the second layer, after the second step.

(Supplementary Description 10)

There is provided a nitride semiconductor substrate, having a diameter of 2 inches or more and having a main surface whose closest low index crystal plane is a (0001) plane, wherein observation of the main surface of the nitride semiconductor substrate with a multiphoton excitation microscope to obtain a dislocation density from a dark spot density, reveals that:

the main surface includes a low dislocation density region with a dislocation density of less than $1 \times 10^6$ cm$^{-2}$, and a high dislocation density region where a dislocation density is higher than the dislocation density of the low dislocation density region and is $3 \times 10^6$ cm$^{-2}$ or less, which are arranged alternately, and at least a part of the low dislocation density region includes a dislocation-free region of 50 μm square or more.

(Supplementary Description 11)

There is provided the nitride semiconductor substrate according to supplementary description 10, wherein density of non-overlapping 50 μm square dislocation-free regions in the entire main surface is 100/cm$^2$ or more.

(Supplementary Description 12)

There is provided the nitride semiconductor substrate according to supplementary description 10 or 11, wherein oxygen concentration is $5 \times 10^{16}$ cm$^{-3}$ or less.

(Supplementary Description 13)

There is provided the nitride semiconductor substrate according to any one of the supplementary descriptions 10 to 12, wherein hydrogen concentration is less than $1 \times 10^{17}$ cm$^{-3}$.

(Supplementary Description 14)

There is provided the nitride semiconductor substrate according to any one of the supplementary descriptions 10 to 13, wherein random extraction of 100 dislocations on the main surface revels that a percentage of dislocations whose Burgers vector is either <11-20>/3, <0001> or <11-23>/3, is 50% or more.

(Supplementary Description 15)

There is provided a laminated structure, including:

a base substrate comprising a single crystal of a group III nitride semiconductor and having a main surface whose closest low index crystal plane is a (0001) plane;

a mask layer provided on the main surface of the base substrate and having a plurality of openings;

a first low oxygen concentration region provided on the main surface of the base substrate through the openings of the mask layer and on the mask layer and comprising a single crystal of a group III nitride semiconductor;

a high oxygen concentration region provided on the first low oxygen concentration region and comprising a single crystal of a group III nitride semiconductor; and a second low oxygen concentration region provided on the high oxygen concentration region and comprising a single crystal of a group III nitride semiconductor, wherein an oxygen concentration in the high oxygen concentration region is higher than an oxygen concentration in each of the first low oxygen concentration region, and the second low oxygen concentration region, and observation of an arbitrary cross section perpendicular to the main surface reveals that, a top surface of the first low oxygen concentration region includes at least one valley and a plurality of tops at an upper side of each of the plurality of openings of the mask layer, and an average distance between a pair of mountains separated in a direction along the main surface is more than 100 μm, the pair of mountains being closest to each other among the plurality of mountains, with one valley sandwiched between them.

(Supplementary Description 16)

There is provided the laminated structure according to the supplementary description 15, wherein the high oxygen concentration region is continuously provided along the main surface of the base substrate.

(Supplementary Description 17)

There is provided the laminated structure according to the supplementary description 15 or 16, wherein the first low oxygen concentration region further includes a pair of inclined portions provided on both sides of the mountain, and an angle formed by the pair of inclined portions is 70° or less.

(Supplementary Description 18)

There is provided the laminated structure according to any one of the supplementary descriptions 15 to 17, wherein a reduction rate of a dislocation density obtained by N/N$_0$ is smaller than a reduction rate of a dislocation density obtained by N'/N$_0$, wherein the dislocation density in the main surface of the base substrate is No and the dislocation density in a boundary surface along the main surface at an upper end of the high oxygen concentration region is N, and the dislocation density in the surface of a crystal layer is N' when the crystal layer of a group III nitride semiconductor is epitaxially grown on the main surface of the base substrate to a thickness equal to a thickness from the main surface to the boundary surface of the base substrate, with only the (0001) plane as a growth surface.

(Supplementary Description 19)

There is provided the laminated structure according to any one of the supplementary descriptions 15 to 18, wherein a thickness of a boundary surface of the second layer at a position where the inclined interface of the second layer disappears, from the main surface of the base substrate is, 1.5 mm or less, and a reduction rate of the dislocation density obtained by N/N$_0$ is 0.3 or less, wherein the dislocation density in the main surface of the base substrate is No, and the dislocation density in the boundary surface of the second layer is N.

DESCRIPTION OF SIGNS AND NUMERALS

1 Nitride semiconductor substrate (substrate)
2 Laminated structure
10 Base substrate
10s Main surface
20 Mask layer
20a Opening
30 First layer
40 Second layer

The invention claimed is:

1. A method for manufacturing a nitride semiconductor substrate, which is a method for manufacturing a nitride semiconductor substrate with a vapor deposition method, comprising:
   a step of preparing a base substrate comprising a single crystal of a group III nitride semiconductor, and having a main surface whose closest low index plane is a (0001) plane;
   a step of forming a mask layer having a plurality of openings on the main surface of the base substrate;
   a first step of epitaxially growing a single crystal of a group III nitride semiconductor on the main surface of the base substrate through the openings of the mask layer, the single crystal of the group III nitride semiconductor being sandwiched between a pair of inclined interfaces other than the (0001) plane and having a top surface with the (0001) plane exposed,
   then, forming a plurality of concaves composed of inclined interfaces other than the (0001) plane on the top surface, gradually expanding the inclined interfaces toward an upper side of the main surface of the base substrate, making the (0001) plane disappear from the top surface, and growing a first layer whose surface is composed only of the inclined interfaces; and
   a second step of epitaxially growing a single crystal of a group III nitride semiconductor on the first layer, making the inclined interfaces disappear, and growing a second layer having a mirror surface,
   wherein in the first step, at least one valley and a plurality of tops are formed at an upper side of each of the plurality of openings of the mask layer by forming the plurality of concaves on the top surface of the single crystal and making the (0001) plane disappear, and
   observation of an arbitrary cross section perpendicular to the main surface reveals that,
   an average distance between a pair of tops separated in a direction along the main surface is more than 100 µm, the pair of tops being closest to each other among the plurality of tops, with one valley sandwiched between them.

2. The method for manufacturing a nitride semiconductor substrate according to claim 1,
   wherein in the step of forming the mask layer,
   the opening of the mask layer is formed in a striped shape, and a pitch of the mask layer is 800 µm or more.

3. The method for manufacturing a nitride semiconductor substrate according to claim 1,
   wherein in the first step,
   the average distance between the pair of tops that are closest to each other, is less than 800 µm.

4. The method for manufacturing a nitride semiconductor substrate according to claim 1,
   wherein in the first step,
   after the (0001) plane disappears from the surface, the growth of the first layer is continued over a predetermined thickness while maintaining a state where the surface is composed only of the inclined interfaces.

5. The method for manufacturing a nitride semiconductor substrate according to claim 1,
   wherein in the first step,
   a first c-plane growth region grown with the (0001) plane as a growth surface is formed in the first layer,
   a convex portion is formed at a position where the (0001) plane disappears and terminates as an inflection point that is convex upward in the first c-plane growth region, and a pair of inclined portions are formed on both sides of the first c-plane growth region interposing the convex portion, as a locus of an intersection between the (0001) plane and the inclined interface, and
   an angle formed by the pair of inclined portions is 70° or less.

6. The method for manufacturing a nitride semiconductor substrate according to claim 1, including
   a step of slicing at least one nitride semiconductor substrate from the second layer, after the second step.

7. A nitride semiconductor substrate, having a diameter of 2 inches or more and having a main surface whose closest low index crystal plane is a (0001) plane,
   wherein observation of the main surface of the nitride semiconductor substrate with a multiphoton excitation microscope to obtain a dislocation density from a dark spot density, reveals that:
   the main surface includes a low dislocation density region with a dislocation density of less than $1\times10^6$ cm$^{-2}$, and a high dislocation density region where a dislocation density is higher than the dislocation density of the low dislocation density region and is $3\times10^6$ cm$^{-2}$ or less, which are arranged alternately, and
   at least a part of the low dislocation density region includes a dislocation-free region of 50 µm square or more.

8. A laminated structure, comprising:
   a base substrate comprising a single crystal of a group III nitride semiconductor and having a main surface whose closest low index crystal plane is a (0001) plane;
   a mask layer provided on the main surface of the base substrate and having a plurality of openings;
   a first low oxygen concentration region provided on the main surface of the base substrate through the openings of the mask layer and on the mask layer and comprising a single crystal of a group III nitride semiconductor;
   a high oxygen concentration region provided on the first low oxygen concentration region and comprising a single crystal of a group III nitride semiconductor; and
   a second low oxygen concentration region provided on the high oxygen concentration region and comprising a single crystal of a group III nitride semiconductor,
   wherein an oxygen concentration in the high oxygen concentration region is higher than an oxygen concentration in each of the first low oxygen concentration region and the second low oxygen concentration region, and
   observation of an arbitrary cross section perpendicular to the main surface reveals that,
   a top surface of the first low oxygen concentration region includes at least one valley and a plurality of tops at an upper side of each of the plurality of openings of the mask layer, and
   an average distance between a pair of mountains separated in a direction along the main surface is more than 100 µm, the pair of mountains being closest to each other among the plurality of mountains, with one valley sandwiched between them.

9. The laminated structure according to claim 8, wherein the high oxygen concentration region is continuously provided along the main surface of the base substrate.

10. The laminated structure according to claim 8, wherein the first low oxygen concentration region further includes a pair of inclined portions provided on both sides of the mountain, and an angle formed by the pair of inclined portions is 70° or less.

11. The laminated structure according to claim 8,
wherein a reduction rate of a dislocation density obtained by $N/N_0$ is smaller than a reduction rate of a dislocation density obtained by $N'/N_0$,
wherein the dislocation density in the main surface of the base substrate is $N_0$ and the dislocation density in a boundary surface along the main surface at an upper end of the high oxygen concentration region is N, and the dislocation density in the surface of a crystal layer is N' when the crystal layer of a group III nitride semiconductor is epitaxially grown on the main surface of the base substrate to a thickness equal to a thickness from the main surface to the boundary surface of the base substrate, with only the (0001) plane as a growth surface.

12. The laminated structure according to claim 8,
wherein a thickness of a boundary surface along the main surface at an upper end of the high oxygen concentration region from the main surface of the base substrate is 1.5 mm or less, and
a reduction rate of the dislocation density obtained by $N/N_0$ is 0.3 or less, wherein the dislocation density in the main surface of the base substrate is $N_0$, and the dislocation density in the boundary surface is N.

* * * * *